US011522079B2

(12) United States Patent
Roizin et al.

(10) Patent No.: US 11,522,079 B2
(45) Date of Patent: Dec. 6, 2022

(54) ELECTROSTATICALLY CONTROLLED GALLIUM NITRIDE BASED SENSOR AND METHOD OF OPERATING SAME

(71) Applicant: Tower Semiconductor Ltd., Migdal Haemek (IL)

(72) Inventors: Yakov Roizin, Afula (IL); Victor Kairys, Karmiel (IL); Ruth Shima-edelstein, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 524 days.

(21) Appl. No.: 16/654,977

(22) Filed: Oct. 16, 2019

(65) Prior Publication Data
US 2021/0119028 A1    Apr. 22, 2021

(51) Int. Cl.
*H01L 29/778*    (2006.01)
*H01L 29/205*    (2006.01)
(Continued)

(52) U.S. Cl.
CPC .......... *H01L 29/7786* (2013.01); *G01J 1/429* (2013.01); *G01N 27/227* (2013.01);
(Continued)

(58) Field of Classification Search
CPC ............. H01L 29/7786; H01L 21/0217; H01L 21/02271; H01L 21/02381; H01L 21/0254;
(Continued)

(56) References Cited

U.S. PATENT DOCUMENTS

| 9,675,262 B2 | 6/2017 | Vitushinsky et al. |
| 11,081,613 B2 * | 8/2021 | Roizin ..................... H05B 3/34 |

(Continued)

FOREIGN PATENT DOCUMENTS

WO    WO2012054683 A2    4/2012

OTHER PUBLICATIONS

Offermans, P. et al., article entitled "Ultra-Sensitive NO2 Detection with AlGaN/GaN 2DEG Channels . . . ", 978-1-4577-1767-3/12, 2012 IEEE, 3 pages.
(Continued)

*Primary Examiner* — Bitew A Dinke
(74) *Attorney, Agent, or Firm* — Bever, Hoffman & Harms, LLP

(57) ABSTRACT

An electrostatically controlled sensor includes a GaN/AlGaN heterostructure having a 2DEG channel in the GaN layer. Source and drain contacts are electrically coupled to the 2DEG channel through the AlGaN layer. A gate dielectric is formed over the AlGaN layer, and gate electrodes are formed over the gate dielectric, wherein each gate electrode extends substantially entirely between the source and drain contacts, wherein the gate electrodes are separated by one or more gaps (which also extend substantially entirely between the source and drain contacts). Each of the one or more gaps defines a corresponding sensing area between the gate electrodes for receiving an external influence. A bias voltage is applied to the gate electrodes, such that regions of the 2DEG channel below the gate electrodes are completely depleted, and regions of the 2DEG channel below the one or more gaps in the direction from source to drain are partially depleted.

21 Claims, 19 Drawing Sheets

(51) Int. Cl.
| | |
|---|---|
| *H01L 29/417* | (2006.01) |
| *H01L 29/51* | (2006.01) |
| *H01L 29/423* | (2006.01) |
| *H01L 23/34* | (2006.01) |
| *H01L 31/113* | (2006.01) |
| *H01L 29/82* | (2006.01) |
| *H01L 31/0304* | (2006.01) |
| *H01L 31/024* | (2014.01) |
| *H01L 29/66* | (2006.01) |
| *H01L 21/02* | (2006.01) |
| *H01L 29/40* | (2006.01) |
| *H01L 31/18* | (2006.01) |
| *G01N 27/22* | (2006.01) |
| *G01R 33/02* | (2006.01) |
| *G01J 1/42* | (2006.01) |
| *H01L 29/20* | (2006.01) |
| *H01L 21/265* | (2006.01) |
| *H01L 21/285* | (2006.01) |
| *H01L 21/266* | (2006.01) |

(52) U.S. Cl.
CPC .......... *G01R 33/02* (2013.01); *H01L 21/0217* (2013.01); *H01L 21/0254* (2013.01); *H01L 21/0262* (2013.01); *H01L 21/02271* (2013.01); *H01L 21/02381* (2013.01); *H01L 23/345* (2013.01); *H01L 29/2003* (2013.01); *H01L 29/205* (2013.01); *H01L 29/401* (2013.01); *H01L 29/41725* (2013.01); *H01L 29/42364* (2013.01); *H01L 29/42372* (2013.01); *H01L 29/517* (2013.01); *H01L 29/518* (2013.01); *H01L 29/66462* (2013.01); *H01L 29/82* (2013.01); *H01L 31/024* (2013.01); *H01L 31/03048* (2013.01); *H01L 31/1136* (2013.01); *H01L 31/1848* (2013.01); *H01L 21/02428* (2013.01); *H01L 21/02433* (2013.01); *H01L 21/266* (2013.01); *H01L 21/2654* (2013.01); *H01L 21/28575* (2013.01)

(58) Field of Classification Search
CPC ............... H01L 21/0262; H01L 23/345; H01L 29/2003; H01L 29/205; H01L 29/401; H01L 29/41725; H01L 29/42364; H01L 29/42372; H01L 29/517; H01L 29/518; H01L 29/66462; H01L 29/82; H01L 31/024; H01L 31/03048; H01L 31/1136; H01L 31/1848; H01L 21/02428; H01L 21/02433; H01L 21/2654; H01L 21/266; H01L 21/28575; H01L 31/022408; H01L 31/1896; H01L 29/0657; H01L 29/41766; H01L 29/7831; G01J 1/429; G01N 27/227; G01N 27/4141; G01R 33/02; G01R 33/0052

See application file for complete search history.

(56) References Cited

U.S. PATENT DOCUMENTS

| | | | | |
|---|---|---|---|---|
| 2009/0032820 | A1* | 2/2009 | Chen | H01L 29/402 |
| | | | | 257/E29.246 |
| 2009/0065810 | A1* | 3/2009 | Honea | H01L 27/0605 |
| | | | | 257/192 |
| 2011/0204807 | A1* | 8/2011 | Hashizume | H01L 29/808 |
| | | | | 315/246 |
| 2014/0001479 | A1* | 1/2014 | Kudymov | H01L 29/7787 |
| | | | | 257/E21.409 |
| 2014/0361343 | A1* | 12/2014 | Sriram | H01L 29/7787 |
| | | | | 257/194 |
| 2016/0190298 | A1* | 6/2016 | Wu | H01L 29/7787 |
| | | | | 257/76 |
| 2017/0125562 | A1* | 5/2017 | Prechtl | H01L 29/42316 |
| 2018/0158936 | A1* | 6/2018 | Chen | H01L 29/205 |
| 2019/0068181 | A1* | 2/2019 | Leong | H03K 17/063 |
| 2019/0355844 | A1* | 11/2019 | Sheridan | H01L 29/2003 |
| 2021/0104601 | A1* | 4/2021 | Luo | H01L 29/7786 |
| 2022/0059675 | A1* | 2/2022 | Shima-Edelstein | |
| | | | | H01L 29/401 |

OTHER PUBLICATIONS

Hung, S.C., et al. article entitled "Detection of chloride ions using an integrated Ag/AgCl electroce . . . ", Applied Physics Letter 92, 193903, May 2008, 4 pages.

Moon, Dong-Il et al., article entitled "Comparative Study of Field Effect Transistor Based Biosensors", IEEE Transactions on Nanotechnology, vol. 15, No. 6, Nov. 2016, 6 pages.

Shimanovich, K., et al., article entitled "CMOS Compatible Electrostatically Formed Nanowire . . . ", IEEE Transactions on Electron Devices, vol. 64, No. 9, Sep. 2017, 5 pages.

Shinohara, K., et al., article entitled "GaN-Based Field-Effect Transistors With Laterally Gated . . . ", IEEE Electron Device Letters, vol. 39, No. 3, Mar. 2018, 4 pages.

* cited by examiner

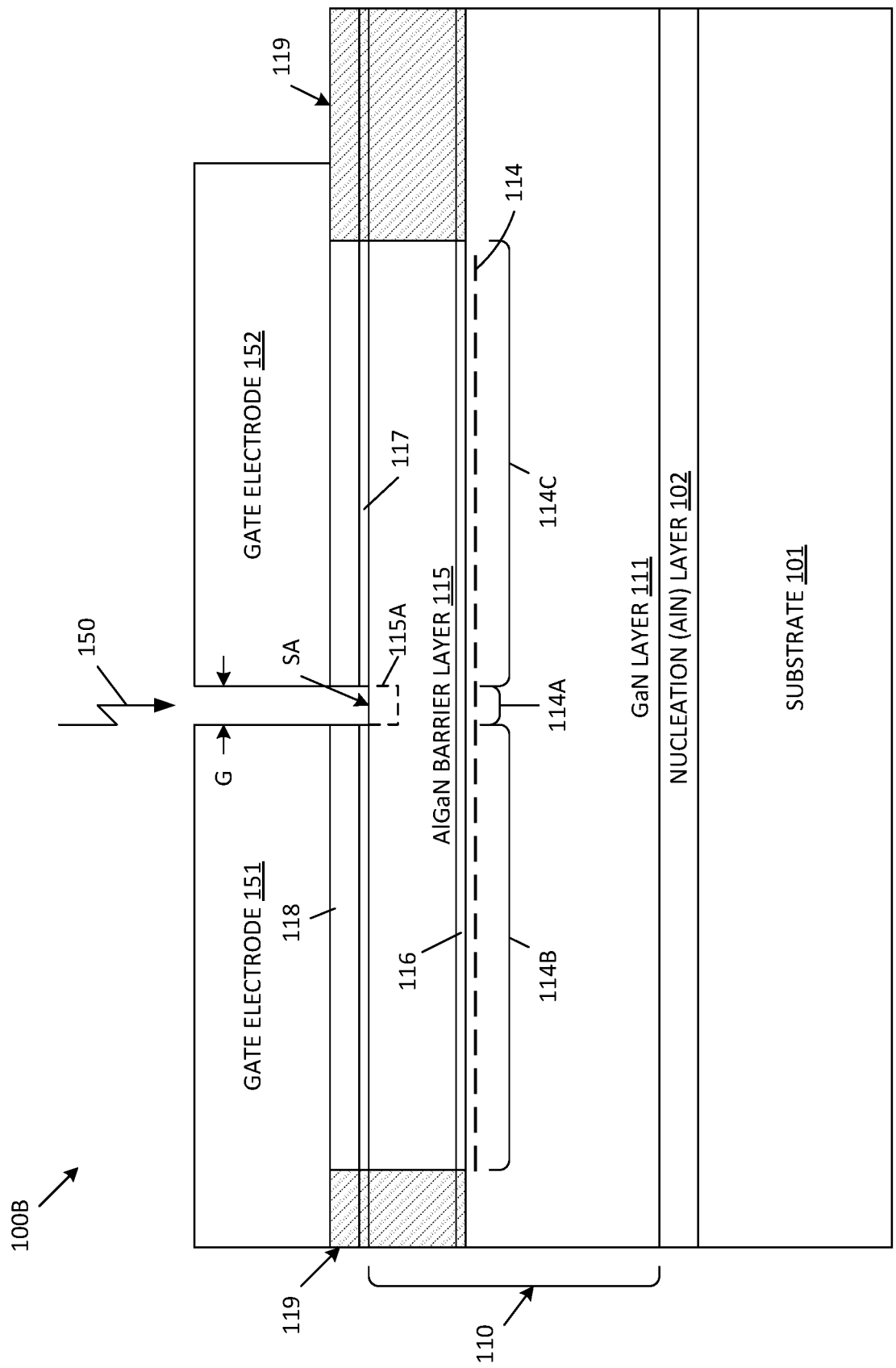

ELECTROSTATICALLY CONTROLLED GALLIUM NITRIDE BASED SENSOR AND METHOD OF OPERATING SAME

FIELD OF THE INVENTION

The present invention relates to Gallium-Nitride (GaN) based sensors and methods for operating these sensors.

RELATED ART

The two-dimensional electron gas (2DEG) channel of GaN based sensors is very sensitive to external influences. The 2DEG channel originates from piezoelectric polarization that is superimposed by electrical charges from an aluminum gallium-nitride (AlGaN) surface formed over a GaN layer. Adsorption of atoms and molecules at this surface leads to significant changes both in charge balance and polarization and thus changes the 2DEG density. Gallium nitride devices can be operated at high temperatures up to 500° C. owing to the 3.4 eV forbidden gap of GaN (as compared to the 1.1 eV gap of silicon). High temperature operation is often needed in gas sensing applications. In addition, strong chemical stability is another sensor requirement, which makes GaN/AlGaN based heterostructures attractive for sensor applications. 2DEG based sensors are described, for example, in WO 2012/054683. AlGaN/GaN 2DEG sensors are also reported by P. Offermans et al., "Ultra-Sensitive $NO_2$ Detection with Channels for Air Quality Monitoring", IEEE Sensors Journal 2012, Date of Conference: 28-31 Oct. 2012, and S. C. Hung et al., "Detection of chloride ions using an integrated Ag/AgCl electrode with AlGaN/GaN high electron mobility transistors", Applied Physics Letters 92, 14 May 2008.

To make AlGaN/GaN devices more sensitive to external influences, the AlGaN layer has been intentionally thinned in the sensing area. This results in decreasing the threshold voltage Vt) of the HEMT structure (i.e., decreasing the density of the 2DEG channel in the sensing area), and brings the device into a regime similar to subthreshold operation of a MOS transistor. In this case, the influence of external surface is more strongly pronounced and hence the sensitivity of the device (changes of the current between source and drain) is increased. An example of a GaN/AlGaN sensor using this approach can be found in U.S. Pat. No. 9,675,262. This sensor includes a 2DEG channel with ohmic contacts connected to electrical metallization, wherein a recess is formed in the GaN/AlGaN hetero-junction structure between the ohmic contacts. A dielectric layer is formed on the top surface of the sensor. This sensor sometimes has an extended gate material formed on the top surface of the dielectric layer and in the recess of the GaN/AlGaN hetero-junction structure. The thickness of AlGaN in the recess region is 5-8 nm. The recess is made by etching a thicker (~20 nm) AlGaN layer, but control of the recessed region thickness is a challenge in the suggested approach.

Using 3D electrostatic configurations to control the potentials of the open spaces in field-effect transistor based chemical sensors has been discussed (e.g., Dong-II Moon et al., "Comparative Study of Field Effect Transistor Biosensors", IEEE Transactions on Nanotechnology, 2016, vol. 15). This reference describes normally-off transistor structures with open surfaces (normally-off HEMTs), which are difficult to achieve in the case of AlGaN/GaN devices with 2DEG channels.

An approach where the channel dimensions are controlled in the direction from source to drain is discussed by K. Shimanovich, et al., "CMOS Compatible Electrostatically Formed Nanowire (EFN) Transistor", IEEE Transactions ED 2017, v.64. No. 9. The described device (with an open surface suitable for chemical sensing) is implemented on silicon and controlled with lateral p-n junctions, which are difficult to implement on GaN due to difficulties with forming of P+ regions.

An approach similar to the above-mentioned EFN transistor is described by K. Shinohara, "GaN Based Field-Effect Transistors with Laterally Gated Two-Dimensional Electron Gas", IEEE Transactions ED, Vol. 39, No. 3, 2018, wherein metal electrodes penetrate into a GaN layer and form Schottky contacts in the GaN bulk. However, it would be difficult to covert the described transistor into a sensor, because the sensing area would be much smaller than the channel area and the device would not be sensitive to small concentrations of the sensed gases or liquids due to non-uniformities of absorption (some of the spaces between the gates would not change their threshold voltages). Technologically, it is difficult to combine the Schottky gates penetrating the GaN bulk and open surface of AlGaN. Such an approach would increase fabrication complexity, require extra etching and cleaning steps. Also, the series resistance of the 2DEG channel would limit device application if converted into a sensor.

It would therefore be desirable to have a sensor having a 2DEG channel with surface exposure that could be operated in the subthreshold regime, so that the resistance of the 2DEG channel could be efficiently modulated by the absorption of atoms at the external surface. It would further be desirable for such a sensor to be inexpensive to fabricate.

SUMMARY

Accordingly, the present invention provides an electrostatically controlled sensor that implements a heterostructure including an AlGaN layer formed over a GaN layer, such that a 2DEG channel is formed at the upper surface of the GaN layer. Source and drain contacts are electrically coupled (either ohmically or capacitively) to the 2DEG channel. A gate dielectric is formed over the AlGaN layer, and a plurality of gate electrodes are formed over the gate dielectric, wherein each of the gate electrodes extends substantially entirely between the source and drain contacts. The gate electrodes are separated by one or more gaps (which also extend substantially entirely between the source and drain contacts). In one embodiment, each of the one or more gaps each has a width in the range of about 0.1 micron to 10 microns between the gate electrodes. Each of the one or more gaps defines a corresponding sensing area between the gate electrodes. In one embodiment, each sensing area has a rectangular shape.

When a voltage is applied across the source and drain contacts, and an appropriate voltage is applied to the gate electrodes, the portions of the 2DEG channel located under the gate electrodes are fully depleted, and the portions of the 2DEG channel located under the one or more gaps between the gate electrodes are partially depleted. The partially depleted portions of the 2DEG channel are sensitive to external influences, such as the presence of certain gasses or liquids, moisture, UV irradiation or magnetic fields. The electrical current flowing between the source and drain contacts (or the measured impedance/capacitance between the source and drain contacts) is a function of the external influence(s) present in the sensing areas. The electrostatically controlled sensor is biased to operate in a subthreshold mode, wherein sensitivity to the external influence(s) is at a maximum.

In one embodiment, the GaN layer is formed over a silicon substrate, such that the sensor can be inexpensively fabricated using well established processing techniques.

In various embodiments, the material exposed in the sensing areas between the one or more gaps can be selected to be: a functionalization layer, the AlGaN layer, a thin GaN layer located over the AlGaN layer, or the gate dielectric material (e.g., silicon nitride or aluminum oxide).

In one embodiment, the GaN layer is located over a substrate, and a cavity is formed through the substrate to expose a portion of a lower surface of the GaN layer. In this embodiment, the portion of the GaN layer located over the cavity forms a membrane having a low thermal mass. The 2DEG channel of the sensor is located within in this membrane. In one embodiment, a heater element is located over the cavity to facilitate thermal refresh of the sensor. The heater element may be implemented by a 2DEG resistor formed in the GaN layer or a polysilicon or metal structure formed over the cavity.

In another embodiment, a front side or backside electrode can be used to provide electrical contact to the GaN layer to facilitate electrical refresh of the sensor.

The present invention will be more fully understood in view of the following description and drawings.

BRIEF DESCRIPTION OF THE DRAWINGS

FIG. 3B is a cross sectional view of a sensor in accordance with another alternate embodiment of the present invention, wherein the portions of a gate dielectric layer and a GaN in a sensing area are removed.

DETAILED DESCRIPTION

In general, the present invention provides an electrostatically controlled sensor that includes a heterostructure having an aluminum gallium nitride (AlGaN) layer formed over a gallium nitride (GaN) layer. A two-dimensional electron gas (2DEG) conductive channel is formed at the upper surface of the GaN layer. Source and drain contacts are coupled (either ohmically or capacitively) to the 2DEG conductive channel. A gate dielectric layer is formed over the AlGaN layer, and gate electrodes are formed over the gate dielectric layer (and over the 2DEG conductive channel). The gate electrodes are separated by small (nanosize) spaces, which extend in the direction of 2DEG current flow between the source and drain contacts.

When a voltage is applied across the source and drain contacts, and an appropriate voltage is applied to the gate electrodes, the portions of the 2DEG channel located under the gate electrodes are fully depleted, and the portions of the 2DEG channel located under the nanosize spaces between the gate electrodes are partially depleted. The partially depleted portions of the 2DEG channel are sensitive to external influences, such as the presence of certain gasses or liquids, moisture, UV irradiation or magnetic fields. The electrical current flowing between the source and drain contacts (or the measured impedance/capacitance between the source and drain contacts) is a function of the external influence(s) received by the AlGaN/GaN heterostructure. The electrostatically controlled sensor operates in a subthreshold mode, wherein sensitivity to the external influence(s) is at a maximum. Persistent photoconductivity (PPC) effects associated with the sensor can be limited/eliminated by electrical and/or thermal refresh operations.

The present invention will now be described in more detail.

Figure 1:
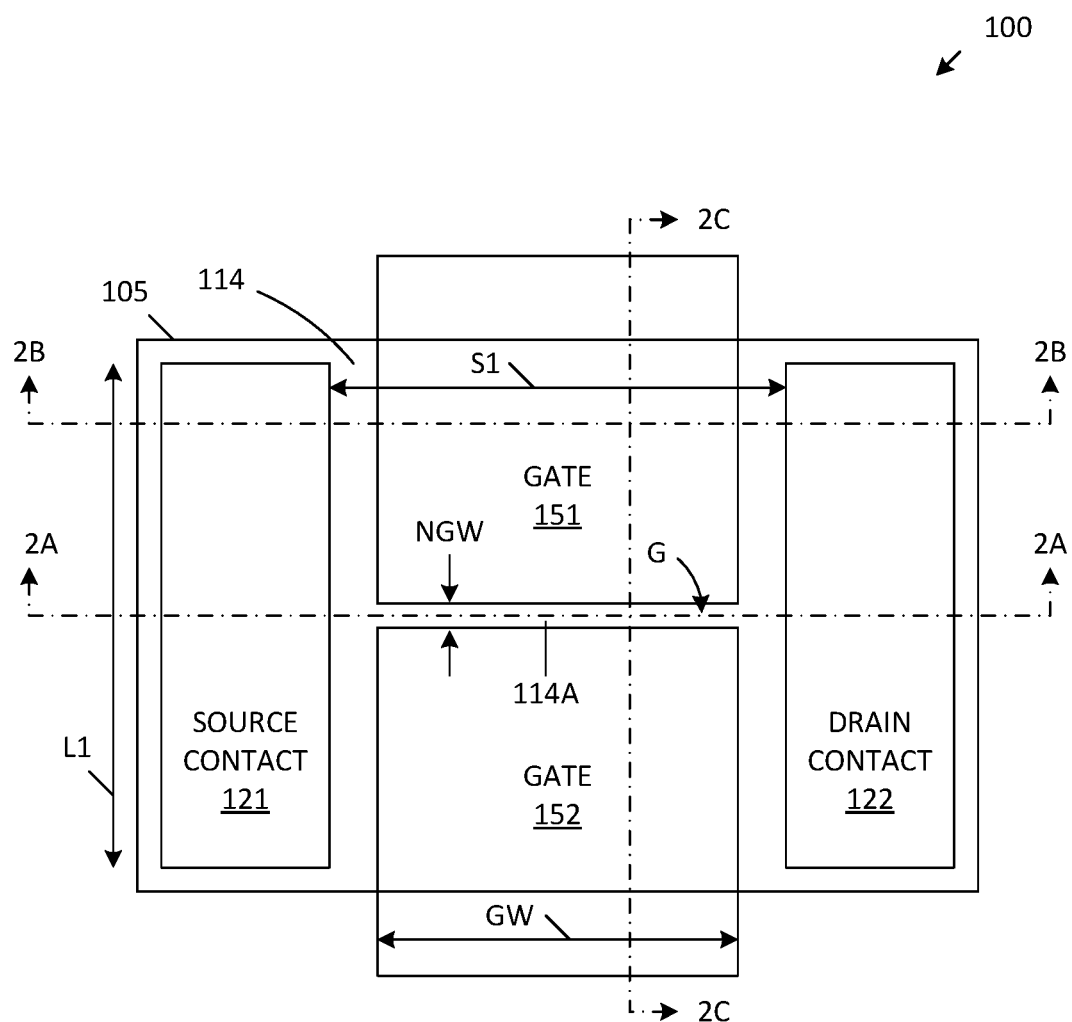
FIG. 1 is a top view of an electrostatically controlled sensor in accordance with one embodiment of the present invention.
Figure 2A:
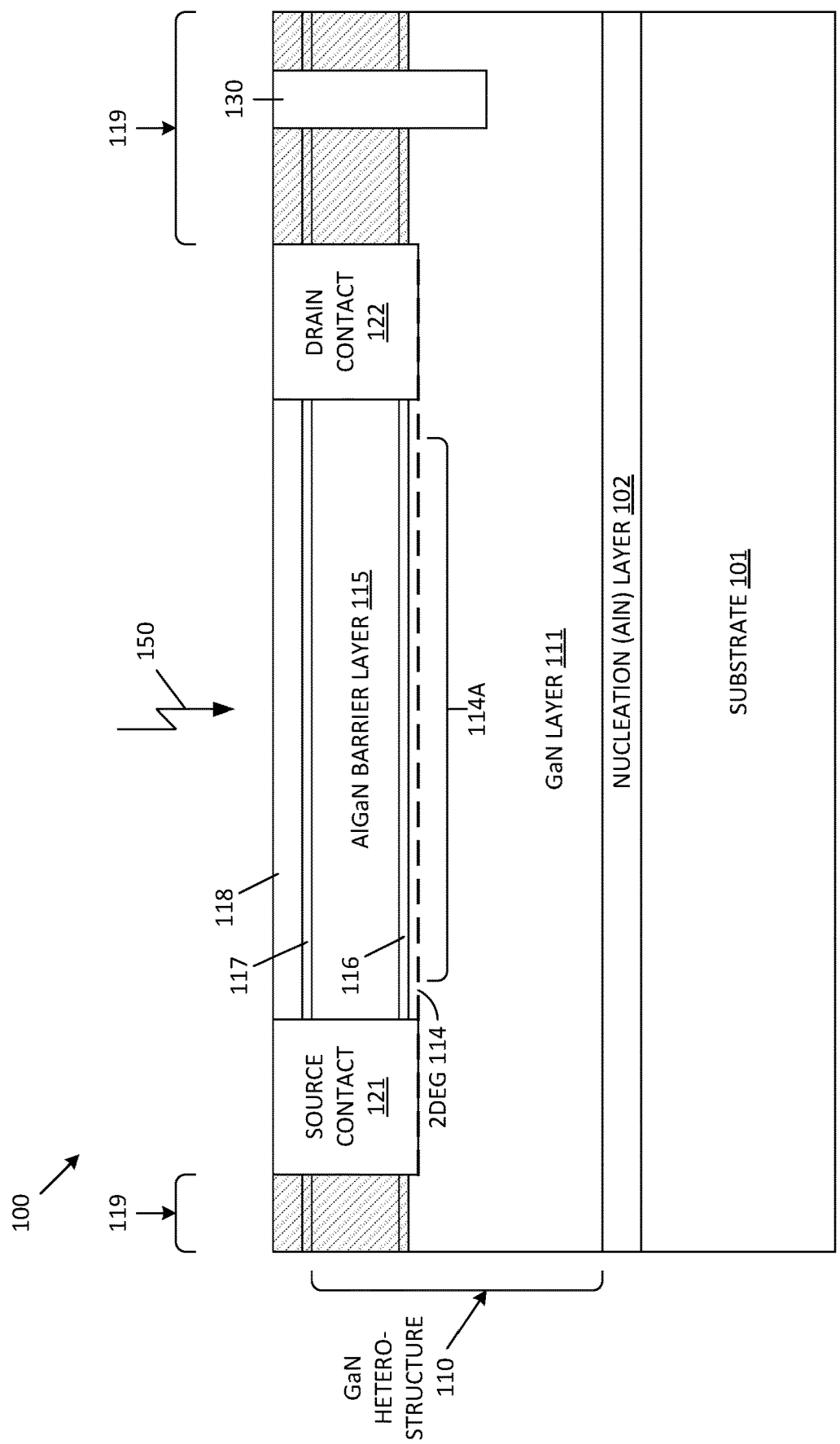
FIG. 2A is a cross-sectional view of the sensor of FIG. 1 along section line 2A-2A in accordance with one embodiment of the present invention.
Figure 2B:
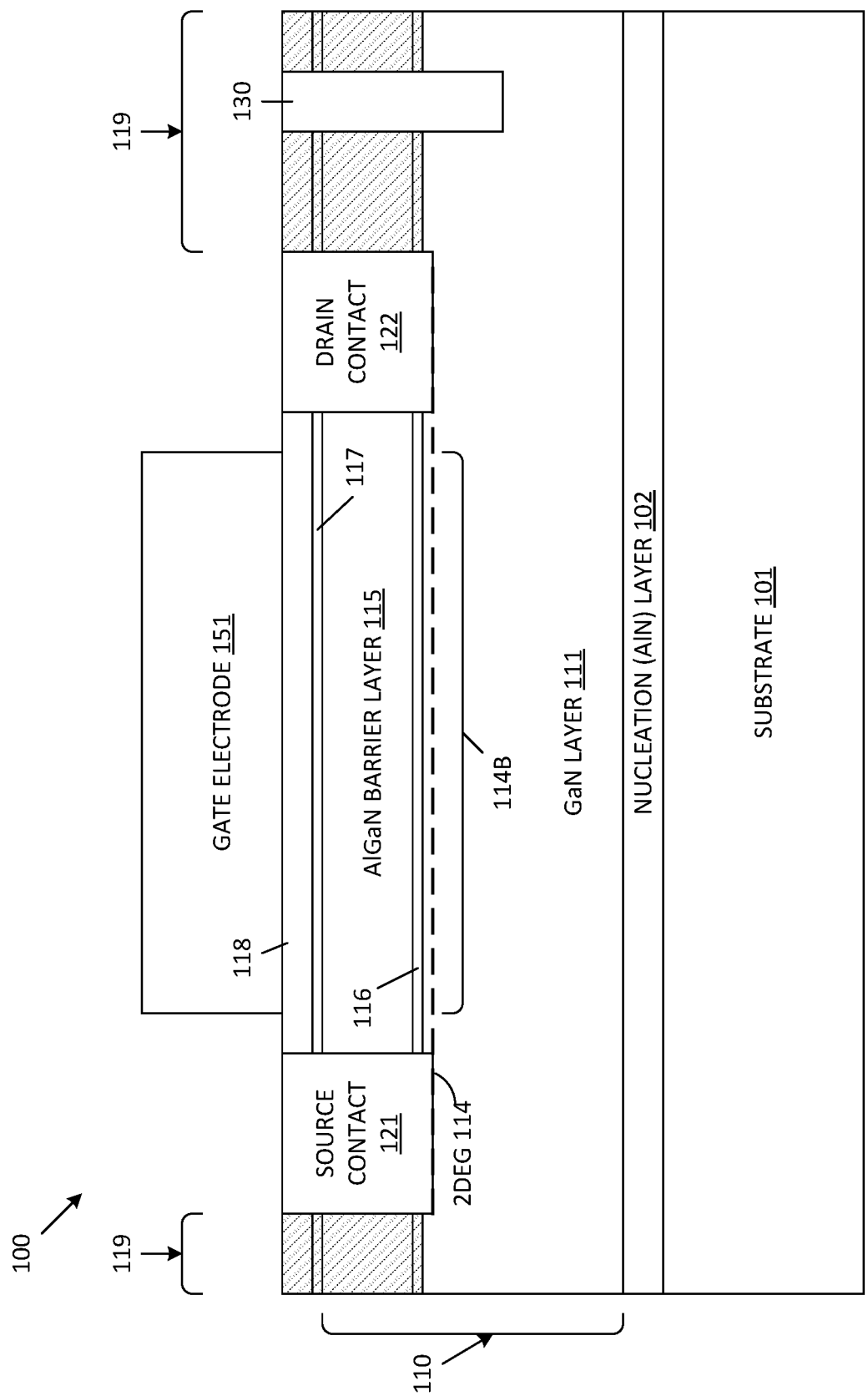
FIG. 2B is a cross-sectional view of the sensor of FIG. 1 along section line 2B-2B in accordance with one embodiment of the present invention.
Figure 2C:
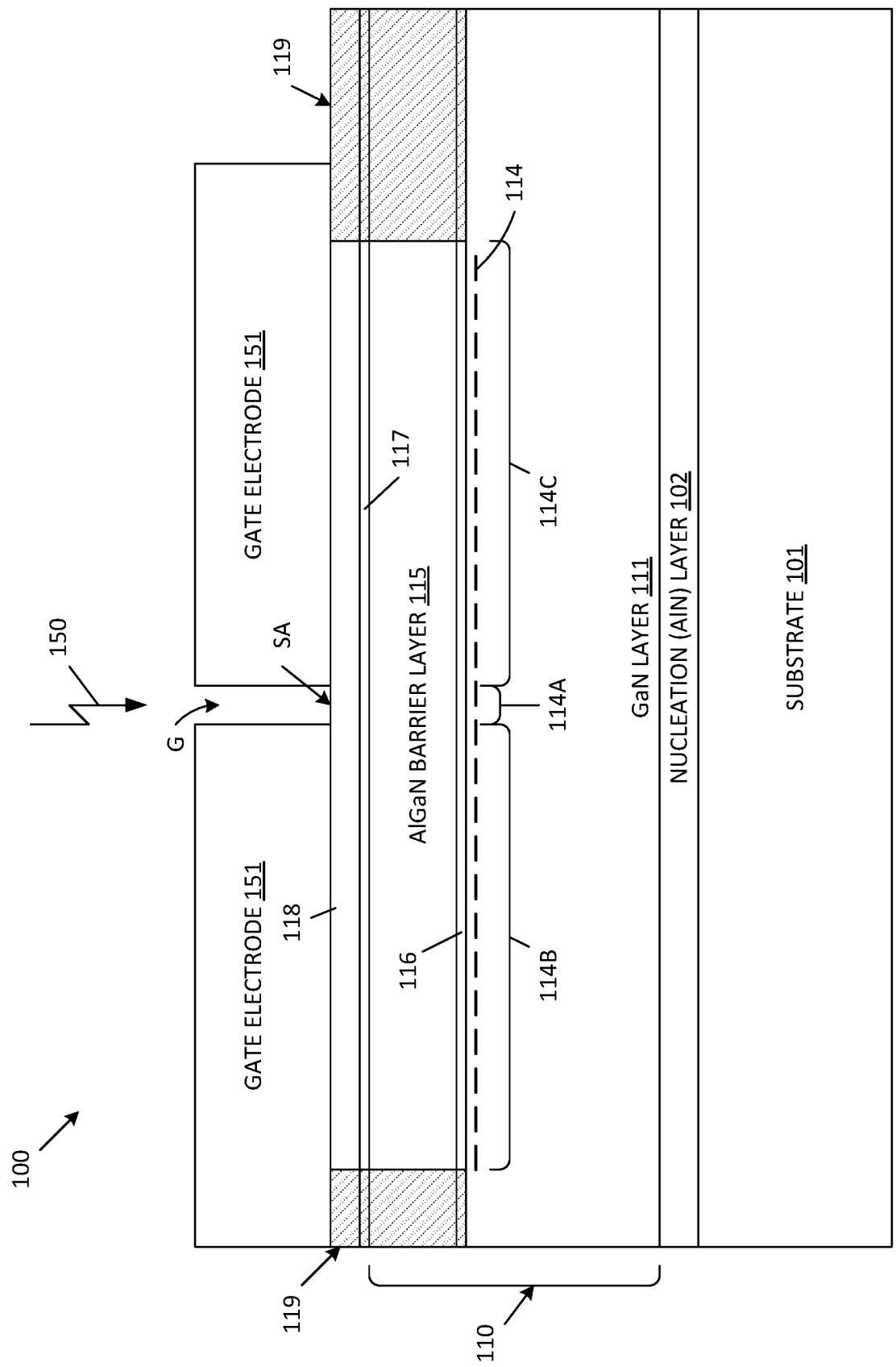
FIG. 2C is a cross-sectional view of the sensor of FIG. 1 along section line 2C-2C in accordance with one embodiment of the present invention.

FIG. 1 is a top view of an electrostatically controlled sensor 100 in accordance with one embodiment of the present invention. FIG. 2A is a cross-sectional view of sensor 100 along section line 2A-2A of FIG. 1. FIG. 2B is a cross-sectional view of sensor 100 along section line 2B-2B of FIG. 1. FIG. 2C is a cross-sectional view of sensor 100 along section line 2C-2C of FIG. 1.

As illustrated by FIG. 1, sensor 100 includes an active region 105, wherein a 2DEG channel 114 is located within active region 105. A source contact 121 and a drain contact 122 are electrically coupled to the underlying 2DEG channel 114. In one embodiment, the source and drain contacts 121-122 have a length L1 of about 50 microns, and are separated by a spacing S1 of about 50 microns. In the described embodiments, source contact 121 and drain contact 122 are separated by a distance S1 in the range of about 10 to 3000 microns. However, other dimensions can be used in other embodiments. A plurality of gate electrodes 151-152 are formed over a gate dielectric layer 118, such that the gate electrodes 151-152 are electrostatically coupled to the underlying 2DEG channel 114. In one embodiment, the gate electrodes 151-152 each have a gate width GW of about 20 microns. The gate electrodes 151-152 are separated by a gap G, which defines an underlying gap region 114A of the 2DEG channel 114. In one embodiment, the gap G has a width NGW in the range of about 0.3 to 3 microns. In another embodiment, the gap G has a width NGW in the range of about 0.1 to 10 microns.

As illustrated by FIGS. 2A, 2B and 2C, sensor 100 is fabricated on a substrate 101. In the described embodiments, substrate 101 is high resistance monocrystalline silicon (having a <111> crystal orientation), advantageously reducing the costs associated with fabricating sensor 100. However, in other embodiments, substrate 101 can be sapphire, silicon carbide (SiC), or a flexible material. Nucleation layer 102 is formed on the upper surface of substrate 101. In the described embodiments, nucleation layer 102 is aluminum nitride (AlN). The composition of nucleation layer 102 is selected to compensate for the mismatch of lattice constants between the substrate 101 and the subsequently formed gallium nitride (GaN) layer 111.

A GaN heterostructure 110, which includes GaN layer 111 and aluminum gallium nitride (AlGaN) layer 115, is formed over nucleation layer 102. More specifically, GaN layer 111 is formed on the nucleation layer 102 using MOCVD epitaxy. In a particular embodiment, GaN layer 111 has a thickness in the range of about 2 to 5 microns, and exhibits a resistance in the range of about 1 MOhm/sq to 1 Tohm/sq. Other thicknesses and resistances are possible in other embodiments.

An AlGaN barrier layer 115 is formed on top of the GaN layer 111. The 2DEG channel 114 is formed at the upper surface of GaN layer 111, adjacent to the AlGaN barrier layer 115. The formation of 2DEG channel 114 is a result of (i) band diagram of AlGaN—GaN potential well for electrons due to mismatch of conduction band edges, and (ii) piezoelectric polarization and the resulting high electric field in the AlGaN barrier layer. In one embodiment, 2DEG channel 114 is formed during the stack growth-MOCVD process, and has a thickness in the range of about 5 to 30 Å (Angstroms) and a sheet resistance about 500 Ohm/sq.

An optional AlN layer 116, having a thickness of 1-2 nm, can be formed between GaN layer 111 and AlGaN barrier layer 115 in order to tune the conductivity of the 2DEG channel 114. The addition of the AlN layer 116 increases the conductivity of the 2DEG channel 114.

An optional GaN layer 117, having a thickness of about 1 to 5 nm, can be formed over AlGaN barrier layer 115. This optional GaN layer 117 protects AlGaN barrier layer 115 from oxidation in the process flow.

A gate dielectric layer 118, having a thickness in the range of about 100 to 1000 Angstroms, is formed over AlGaN barrier layer 115. In one embodiment, gate dielectric layer 118 is silicon nitride. In other embodiments, gate dielectric layer 118 can include other dielectric materials, such as silicon oxide, silicon oxynitride, aluminum oxide or hafnium oxide. In accordance with one embodiment, gate dielectric layer 118 is formed in situ during the MOCVD process (i.e., in the same deposition chamber used to fabricate GaN layer 111 and AlGaN barrier layer 115). In an alternate embodiment, gate dielectric layer 118 is deposited ex situ (in an external tool during) device integration.

In one embodiment, source contact 121, drain contact 122 and gate electrodes 151-152 are formed from the same electrically conductive structure (e.g., a metal stack). A photoresist mask (not shown) is formed over gate dielectric layer 118, wherein this mask includes openings that define the locations where source contact 121 and drain contact 122 are to be formed. A series of etches are performed through the openings in the mask, wherein a first etch removes exposed portions of the gate dielectric layer 118, a second etch removes exposed portions of the optional GaN layer 117 (if present), and an additional etch partially removes exposed portions of the AlGaN barrier layer 115. For example, if AlGaN barrier layer 115 has a thickness of 20 nm, then the etch removes only about 10 nm of the AlGaN barrier layer 115. The mask is removed, and a metal stack (or other electrically conductive structure) is subsequently formed over the resulting structure, wherein the metal stack is formed in the openings formed in the AlGaN barrier layer 115, and also over the remaining portions of gate dielectric layer 118. The metal stack may be formed by sputtering a thin layer of titanium (Ti) and then sputtering a layer of aluminum (Al) over the thin titanium layer. An optional titanium nitride (TiN) layer may be formed over the aluminum layer. In one embodiment, the metal stack has a thickness in the range of about 0.1 microns to 1.0 micron. The metal stack is then patterned (e.g., masked and etched) to remove any unnecessary portions (e.g., portions not required to form the source and drain contacts 121-122 and the gate electrodes 151-152). Note that patterning of the metal stack results in the formation of gate electrodes 151 and 152, including the gap G between gate electrodes 151 and 152. During subsequent rapid thermal processing (RTP), the aluminum present in the metal stacks formed in the source and drain contact regions supposedly diffuses to the underlying 2DEG channel 114 through the thin Ti layer, thereby creating source and drain contacts 121-122 as illustrated by FIGS. 2A-2B, which are in electrical contact with the 2DEG channel 114.

Although the fabrication of source and drain contacts 121-122 and gate electrodes 151-152 have been described in accordance with a particular process, it is understood that these structures can be fabricated using other processes in other embodiments. It is noted that gate electrodes 151-152 extend from the area immediately adjacent to source contact 121 to the area immediately adjacent to drain contact 122, such that the 2DEG channel region 114A extends substantially entirely from the source contact 121 to the drain contact 122. In one embodiment, the distances between the gate electrodes 151-152 and the source/drain contacts 121-122 are minimized based on the constraints of the fabrication process. In another embodiment, gate electrodes 151-152 span at least about 50 percent of the distance S1 between the source and drain contacts 121-122. In one embodiment, this relationship is maintained for each of the sensors described herein.

The portions of 2DEG channel 114 located under gap G, gate electrode 151 and gate electrode 152 are labeled as 2DEG channel regions 114A, 114B and 114C, respectively.

As illustrated by FIGS. 2A and 2B, a front side electrode 130 is formed to provide an electrical contact to the GaN layer 111. In the illustrated embodiment, the front side electrode 130 extends through the gate dielectric layer 118 and the AlGaN barrier layer 115 (and any of the included optional layers 116-118). In one embodiment, the fabrication of front side electrode 130 includes forming device isolation by implantation with ions of an inert gas (e.g., Ar, N). In the illustrated embodiment, this implantation occurs in region 119 (using an implant mask), such that the AlGaN barrier layer 115 (and any of the included optional layers 116-118) in this region 119 become non-conductive, as illustrated by the shaded layers of FIG. 1. This implantation also annihilates the 2DEG channel 114 in this region 119 (effectively defining the active region 105 illustrated by FIG. 1).

A mask defining the location of front side electrode 130 is formed over the resulting structure, and an etch is performed through this mask to form a deep opening that extends through the non-conductive material(s) and into GaN layer 111. Front side electrode 130 is then created by depositing metal in this deep opening. Although front side electrode 130 is shown in the embodiment of FIGS. 2A and 2B, a back side electrode (shown below in FIGS. 11A-11B) can alternately be used to provide an electrical connection to GaN layer 111 in other embodiments.

As described in more detail below, the space between the gate electrodes 151 and 152 (within the gap G) defines a rectangular shaped sensing area (SA). In the embodiment illustrated by FIG. 2C, gate dielectric layer 118 is exposed at the upper surface of the sensing area SA. In other embodiments, different layers can be exposed at the upper surface of the sensing area SA.

Figure 3A:
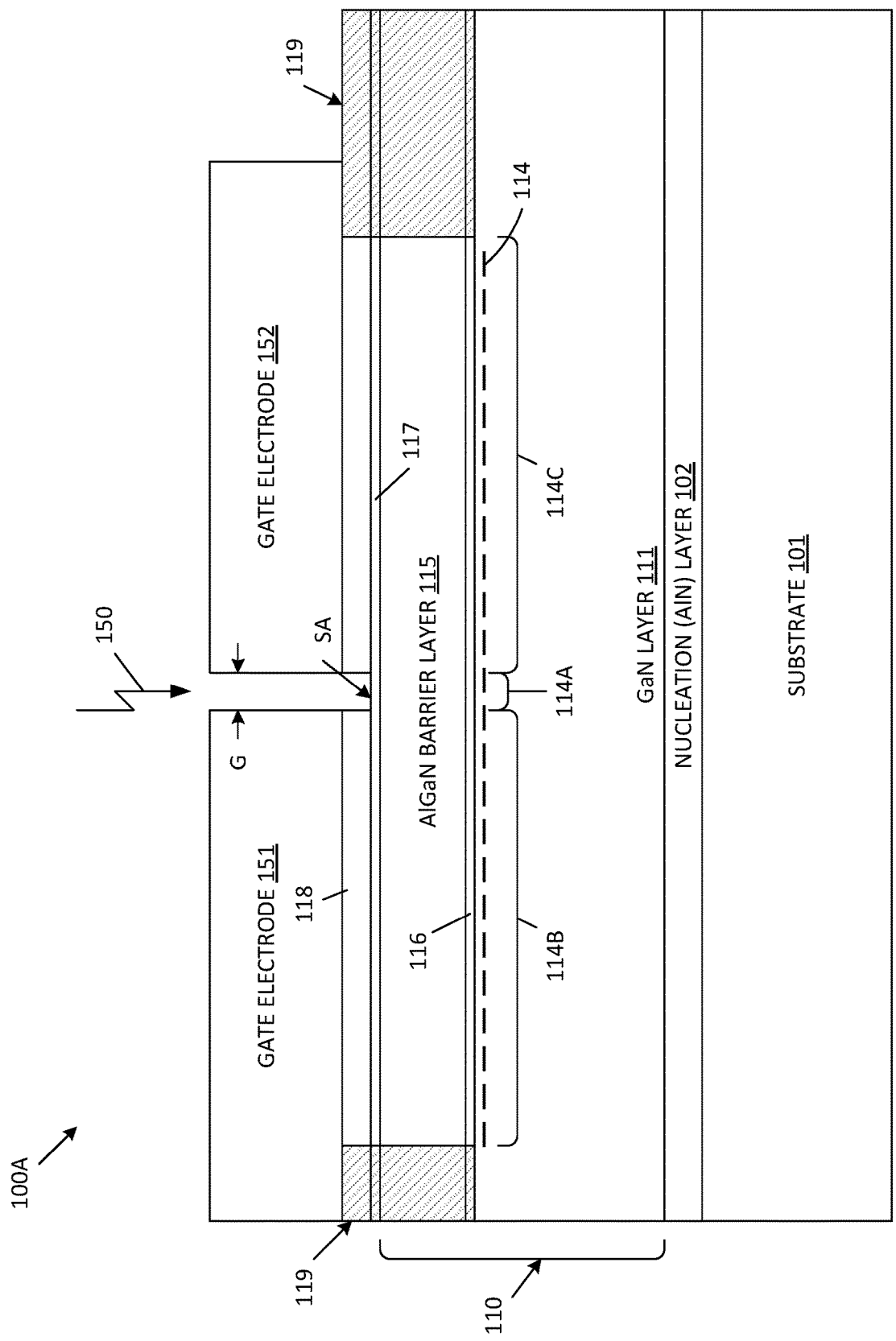
FIG. 3A is a cross sectional view of a sensor in accordance with an alternate embodiment of the present invention, wherein portions of a gate dielectric layer in a sensing area are removed.

FIG. 3A is a cross sectional view of a sensor 100A in accordance with an alternate embodiment of the present invention, wherein the portion of the gate dielectric layer 118 in the sensing area SA is removed (e.g., by etching), such that GaN layer 117 is exposed at the upper surface of the sensing area SA.

FIG. 3B is a cross sectional view of a sensor 100B in accordance with another alternate embodiment of the present invention, wherein the portions of the gate dielectric layer 118 and the GaN layer 117 in the sensing area SA are removed (e.g., by etching), such that AlGaN layer 115 is exposed at the upper surface of the sensing area SA. In one variation, the AlGaN layer 115 of FIG. 3B can also be partially etched (thinned) in the sensing area SA (i.e., in the region defined by dashed line 115A in FIG. 3B), which may improve the sensitivity of the sensor 100B and decrease the voltages applied to gates 151-152 in the operation mode.

In one embodiment, the etchings illustrated by FIGS. 3A and 3B are implemented through the same mask used to define the source and drain contacts 121-122 and gate electrodes 151-152. That is, the metal etch is continued (with different chemistry) to remove exposed portions of gate dielectric layer 118, GaN layer 117 and AlGaN layer 115 in the manners described above.

Note that because sensors 100A (FIG. 3A) and 100B (FIG. 3B) are similar to sensor 100 (FIGS. 2A-2C), similar elements in FIGS. 2A-2C and 3A-3B are shown with similar reference numbers.

As described in more detail below, the conductivities of the sensors 100, 100A and 100B are influenced by external influences 150, such as the presence of a gas and/or liquid, the ambient humidity, the presence of a magnetic field, the presence of ultra-violet irradiation, or the ambient temperature. The different materials exposed at the upper surfaces of the sensing areas SA in sensors 100, 100A and 100B advantageously allow these sensors to exhibit different sensing characteristics for different external influences 150.

Figure 4:
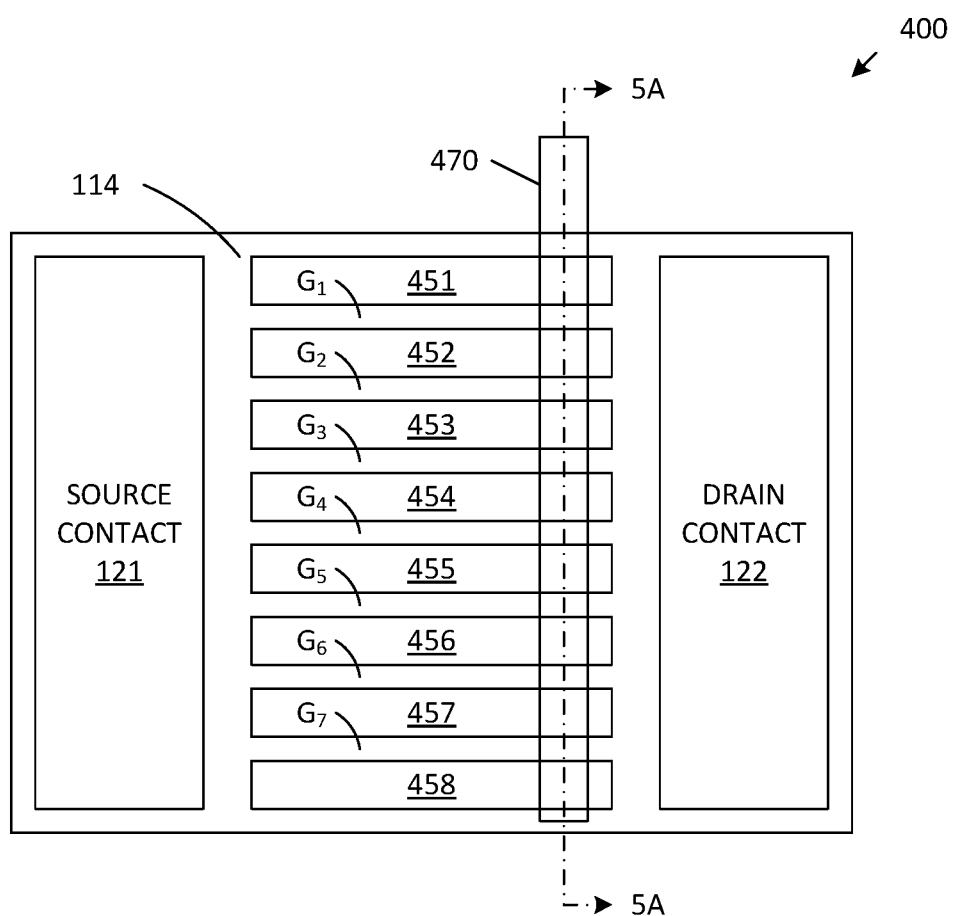
FIG. 4 is a top view of an electrostatically controlled sensor having more than two gate electrodes in accordance with an alternate embodiment of the present invention.
Figure 5A:
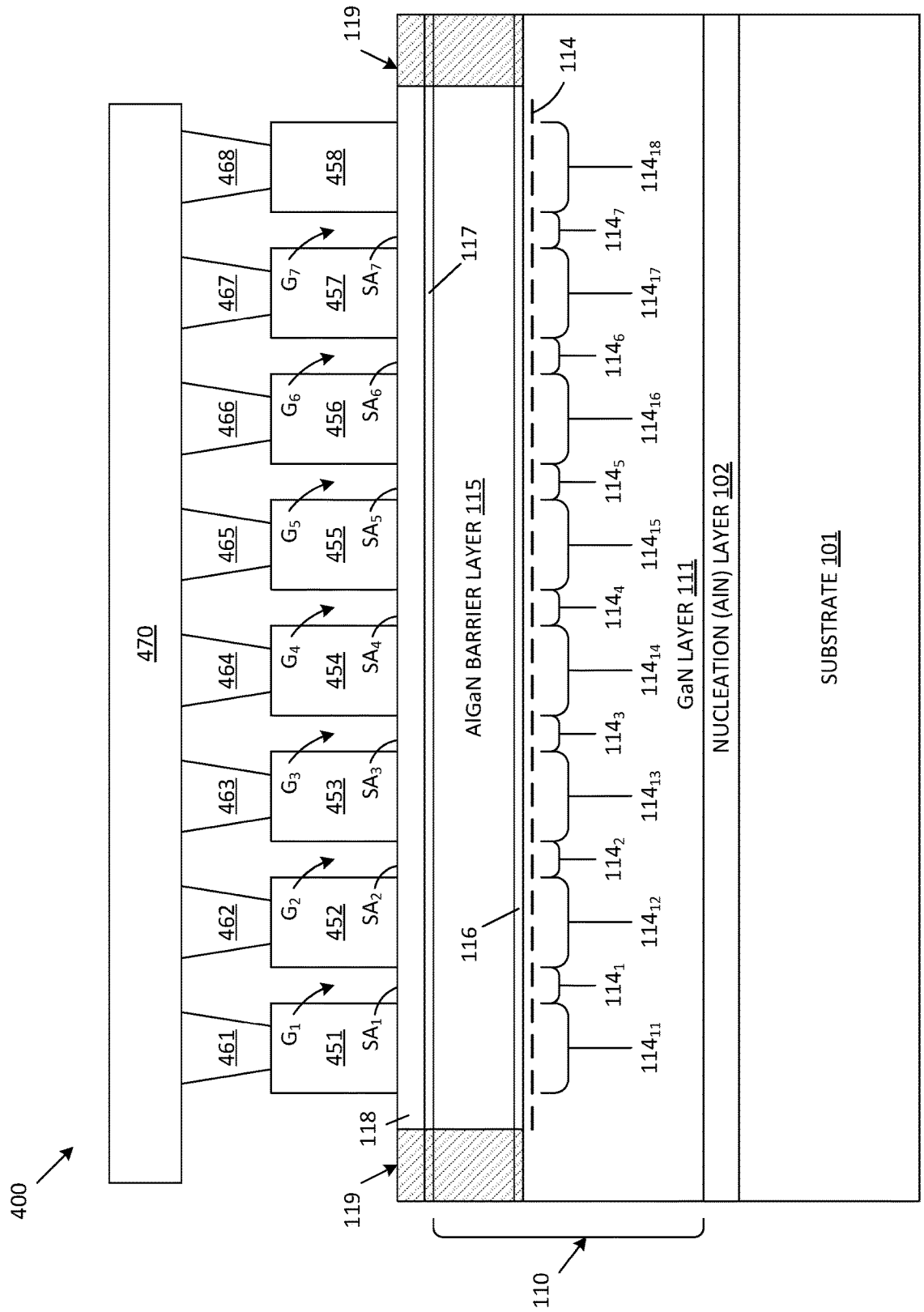
FIG. 5A is a cross-sectional view of the sensor of FIG. 4 along section line 5A-5A in accordance with one embodiment of the present invention.

FIG. 4 is a top view of an electrostatically controlled sensor 400 in accordance with an alternate embodiment of the present invention. FIG. 5A is a cross-sectional view of sensor 400 along section line 5A-5A of FIG. 4. Because sensor 100 (FIGS. 1 and 2A-2C) is similar to sensor 400, similar elements in FIGS. 1, 2A-2C 4 and 5A are labeled with similar reference numbers. As illustrated by FIGS. 4 and 5A, a plurality of gate electrodes 451-458 extend in parallel over 2DEG channel 114, between source contact 121 and drain contact 122. A plurality of parallel gaps $G_1$-$G_7$ exist between gate electrodes 451-458. These gaps $G_1$-$G_7$ define sensing areas $SA_1$-$SA_7$ and underlying parallel 2DEG channel regions $114_1$-$114_7$, respectively, of the 2DEG channel 114. In one embodiment, the sensing areas $SA_1$-$SA_7$ extend substantially entirely between the source and drain contacts 121 and 122. In another embodiment, the sensing areas $SA_1$-$SA_7$ extend at least about 50 percent of the distance the source and drain contacts 121 and 122. In one embodiment, each of the gaps $G_1$-$G_7$ has a width in the range of about 0.3 to 3 microns. The portions of 2DEG channel 114 located under gate electrodes 451-458 are labeled as 2DEG channel regions $114_{11}$-$114_{18}$, respectively. Contacts 461-468 provide electrical connections between gate electrodes 451-458, respectively, and metal trace 470. (Note that inter-metal dielectric layers are not shown in FIG. 5A.) Thus, a voltage applied to metal trace 470 is applied to each of the gate electrodes 451-458. Although eight gate electrodes 451-458 (and seven sensing areas $SA_1$-$SA_7$) are included in sensor 400, it is understood that other numbers of gate electrodes and sensing areas can be included in other embodiments. As described in more detail below, if each of the seven 2DEG channel regions $114_1$-$114_7$ has the same dimensions as the 2DEG channel region 114A (of sensor 100), then the sensing current ($I_D$) of sensor 400 may be 7 times the sensing current of sensor 100.

Figure 5B:
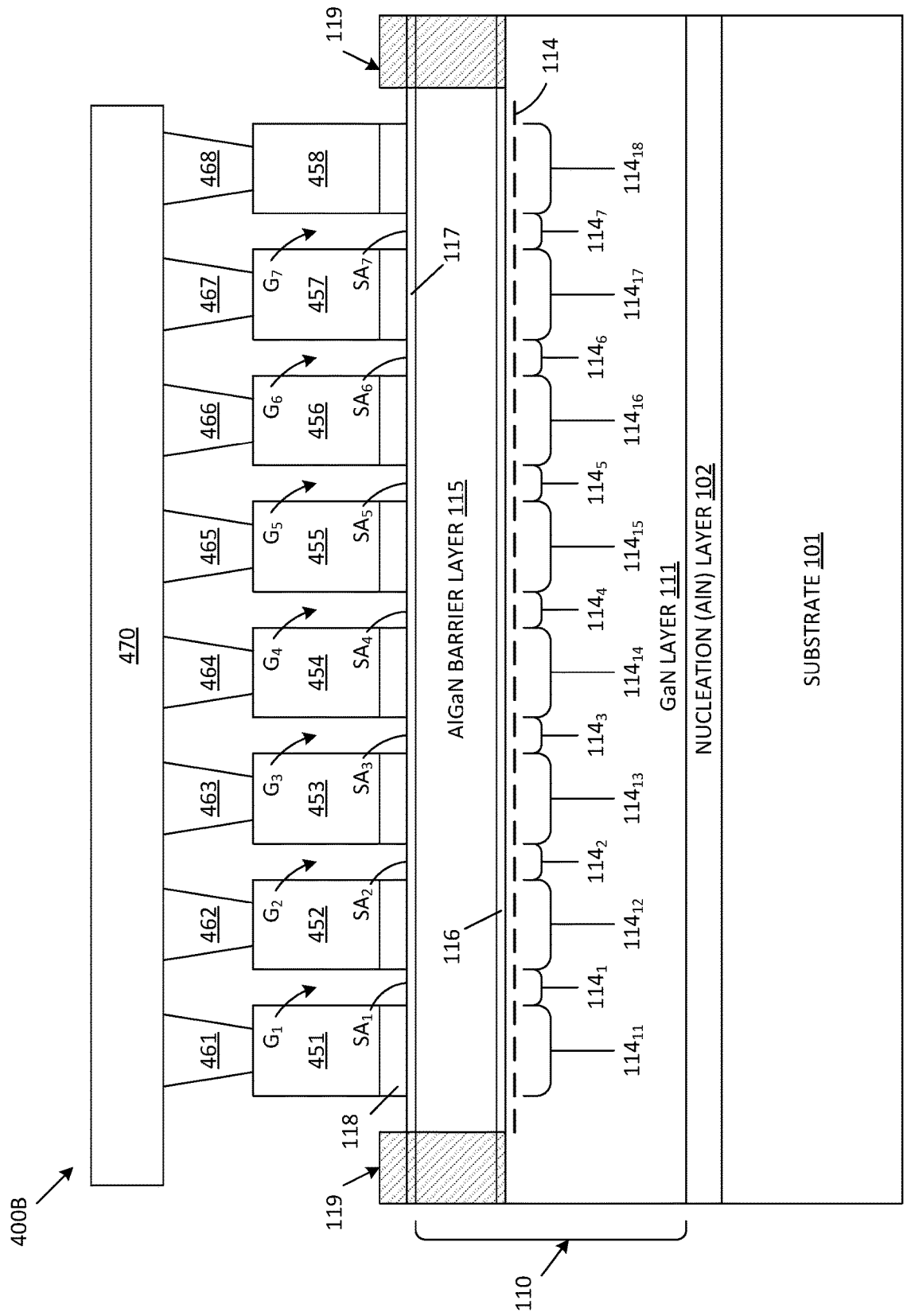
FIG. 5B is a cross sectional view of a sensor in accordance with an alternate embodiment of the present invention, wherein the portions of a gate dielectric layer located between gate electrodes are removed.

FIG. 5B is a cross sectional view of a sensor 400B in accordance with an alternate embodiment of the present invention, wherein the portions of the gate dielectric layer 118 in the gaps $G_1$-$G_7$ are removed (e.g., by etching), such that GaN layer 117 is exposed at the upper surface of the sensing area (in a manner similar to that described above in connection with FIG. 3A).

Figure 5C:
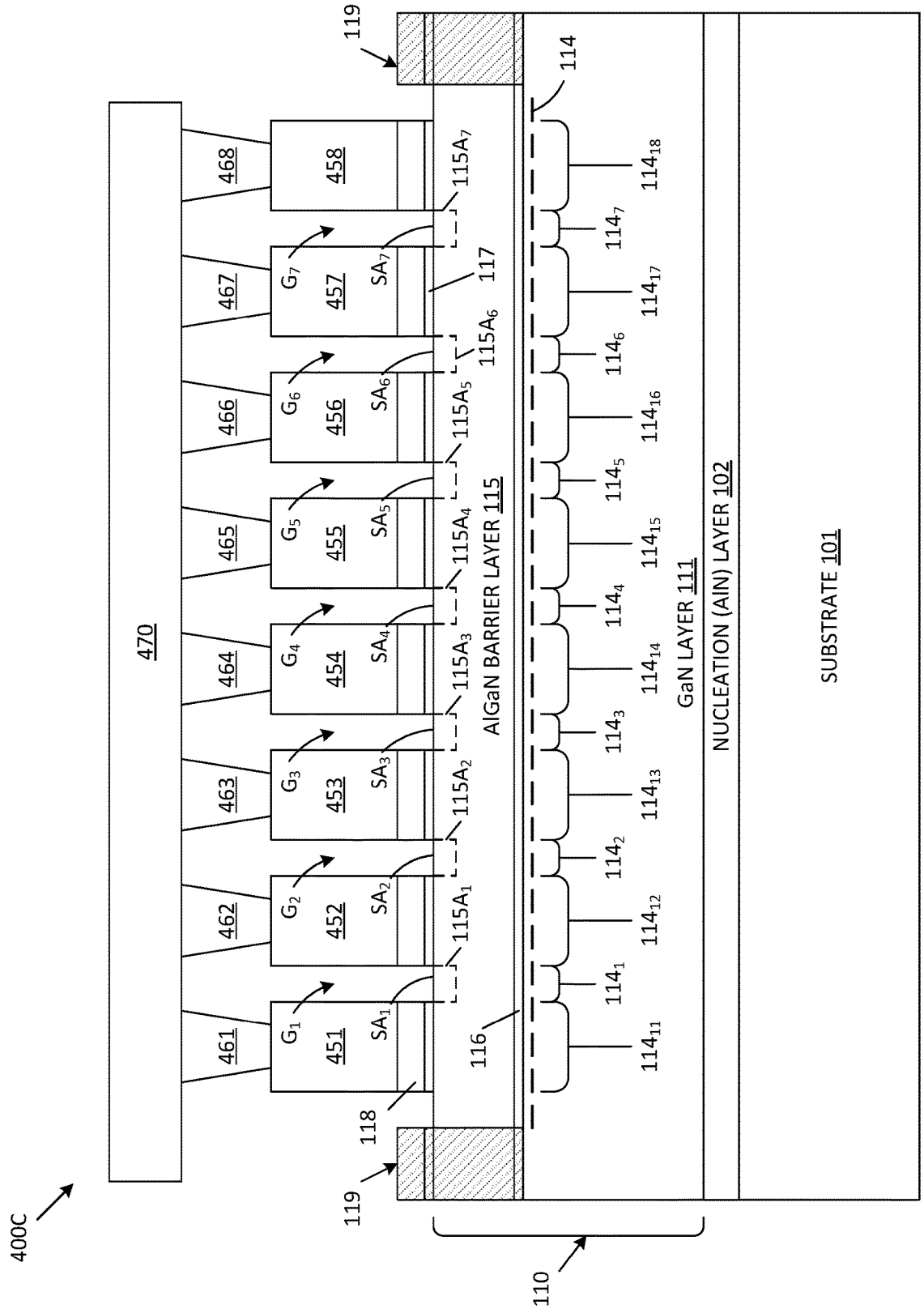
FIG. 5C is a cross sectional view of a sensor in accordance with another alternate embodiment of the present invention, wherein the portions of a gate dielectric layer and GaN layer located between gate electrodes are removed.

FIG. 5C is a cross sectional view of a sensor 400C in accordance with another alternate embodiment of the present invention, wherein the portions of the gate dielectric layer 118 and the GaN layer 117 in the gaps $G_1$-$G_7$ are removed (e.g., by etching), such that AlGaN layer 115 is exposed at the upper surface of the sensing area (in a manner similar to that described above in connection with FIG. 3B). In one variation, the AlGaN layer 115 of FIG. 5C can also be partially etched (thinned) within gaps $G_1$-$G_7$ (i.e., in the regions defined by dashed lines $115A_1$-$115A_7$ in FIG. 5C), which may improve the sensitivity of the sensor 400C and decrease the voltages applied to gates 451-458 in the operation mode.

Again, the different materials exposed at the upper surfaces of the sensing areas SA in sensors 400, 400A and 400B advantageously allow these sensors to exhibit different sensing characteristics for different external influences 150. In one variation, a functionalization layer is exposed at the upper surface of the sensing area SA.

Figure 5D:
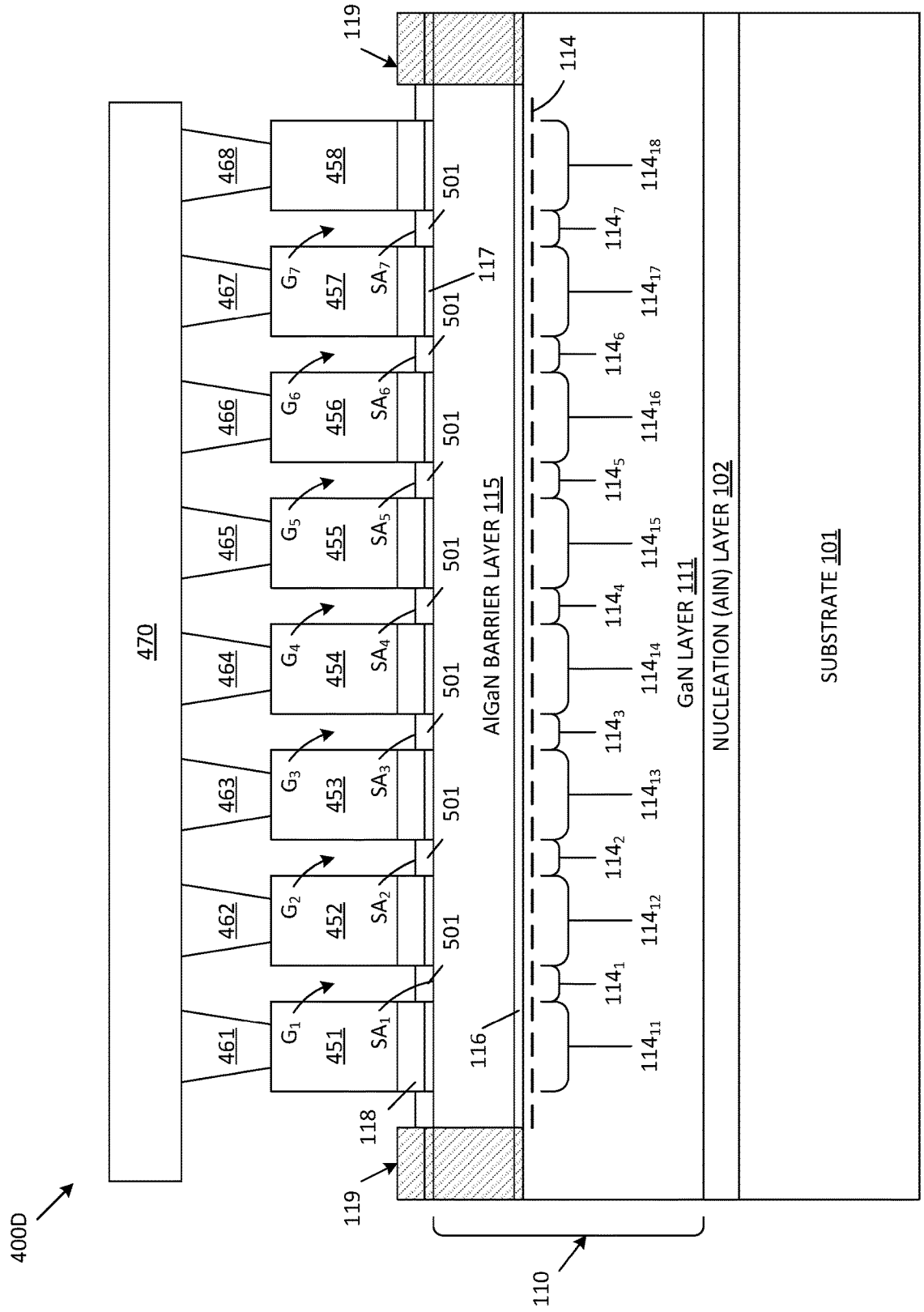
FIG. 5D is a cross sectional view of a sensor in accordance with another alternate embodiment of the present invention, which includes a functionalization layer formed on the exposed portions of the AlGaN barrier layer of the structure of FIG. 5C.

FIG. 5D is a cross sectional view of a sensor 400D, which includes a functionalization layer 501 formed on the exposed portions of the AlGaN barrier layer 115 of the structure of FIG. 5C. The functionalization layer can include, for example, nanoparticle surface structures (e.g., platinum nanodots) or cross-liners (organic molecules attached to the surface and having two ends, e.g., intended for protein-to-protein interaction in biology). Functionalization layer 501 can include other materials in other embodiments, depending upon the particular application of sensor 400D. Although functionalization layer 501 is show in combination with the structure of the sensor 400C of FIG. 5C, it is understood that in other embodiments, the functionalization layer 501 is located on the exposed portions of gate dielectric layer 118 in the embodiments of FIGS. 2C and 5A, on the exposed portions of the GaN layer 117 in the embodiments of FIGS. 3A and 5B, or on the exposed portions of the AlGaN barrier layer 115 (or in the corresponding partially thinned portions of the AlGaN barrier layer 115) in the embodiments of FIGS. 3B and 5C.

The operation of sensor 100 (and sensor 400) will now be described. In general, sensor 100 is a modified depletion mode 2DEG high electron mobility transistor (HEMT) which is capable of operating in a subthreshold mode and an accumulation mode. These modes are described in more detail below in connection with FIG. 6.

Figure 6:
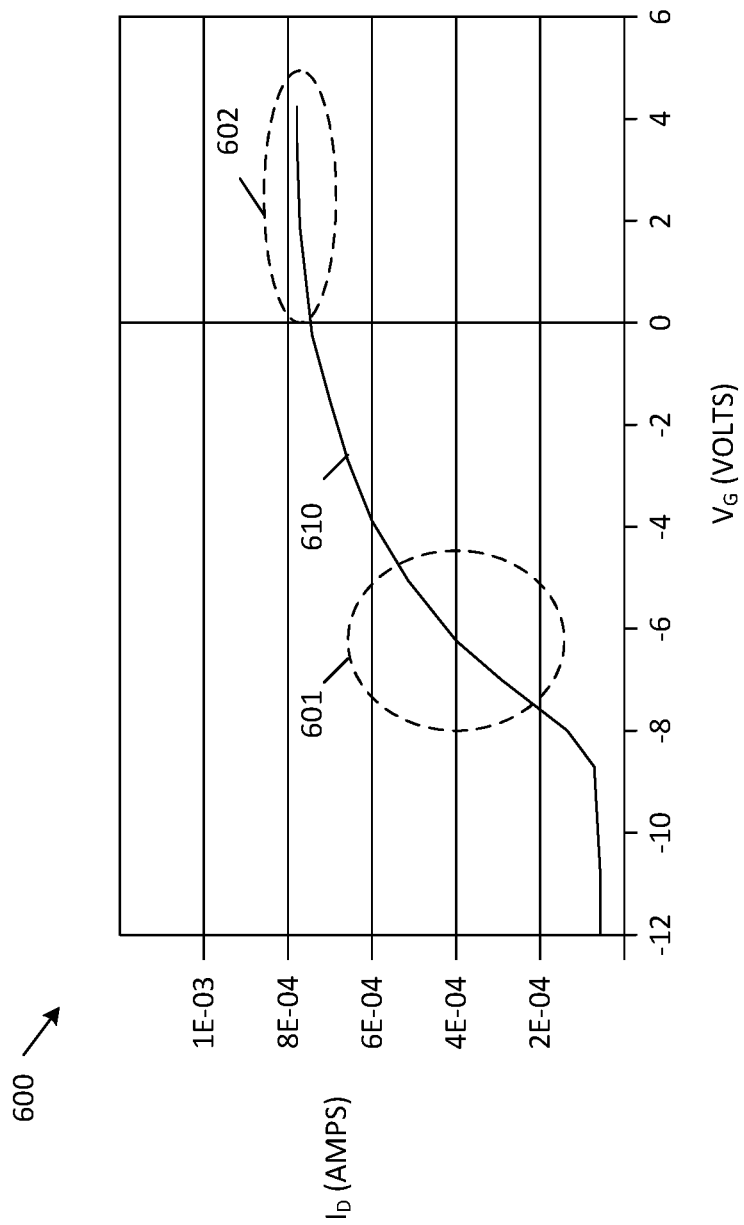
FIG. 6 is a graph illustrating drain currents of a narrow HEMT transistor for various gate voltages, at a constant source-to-drain voltage.

FIG. 6 is a graph 600 illustrating the drain current ($I_D$) of a conventional narrow (5 um width, 50 um length) HEMT transistor for various gate voltages ($V_G$), at a constant source-to-drain voltage ($V_{SD}$). Curve 610 illustrates the $I_D$ vs $V_G$ characteristics. In the illustrated example, the source-to-drain voltage ($V_{SD}$) is about 3 Volts (e.g., the source contact is held at 0 Volts and the drain contact is held at 3 Volts). In subthreshold region 601 (i.e., for gate voltages $V_G$ in the range of about −8 to −4 Volts) the 2DEG channel region under the gate electrode is partially depleted, such that the drain current $I_D$ is low, but strongly depends on changes of the gate voltage $V_G$. In accumulation region 602 (i.e., for gate voltages $V_G$ in the range of about 0 to 4 Volts), the 2DEG channel region under the gate electrode is not depleted, such that the drain current $I_D$ is high, but the sensitivity to changes in the gate voltage $V_G$ is low.

Figure 7:
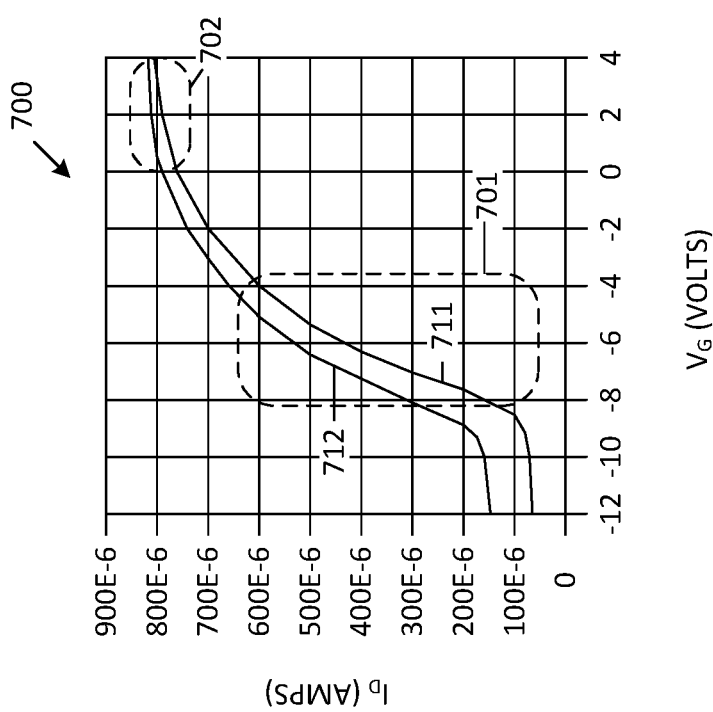
FIG. 7 is a graph illustrating drain currents of the electrostatically controlled sensor of FIG. 1 for various gate voltages, at a constant source-to-drain voltage of 3 Volts, without any exposure to external influences.

FIG. 7 is a graph 700 illustrating the drain current ($I_D$) of electrostatically controlled sensor 100 for various gate voltages ($V_G$), at a constant source-to-drain voltage ($V_{SD}$) of 3 Volts (e.g., source contact 121 is held at 0 Volts and drain contact 122 is held at 3 Volts), without any exposure to external influences 150. When a large negative voltage (e.g., −9 Volts or more negative) is applied to the gate electrodes 151-152, the underlying 2DEG channel 114 (including 2DEG channel regions 114A-114C) is fully depleted. As the gate voltage $V_G$ increases, the drain current $I_D$ increases.

In subthreshold region 701 (i.e., for gate voltages $V_G$ in the range of about −8 to −4 Volts) the 2DEG channel regions 114B and 114C under the gate electrodes 151 and 152 are fully depleted, and the 2DEG channel region 114A under gap G (and sensing area SA) is partially depleted, such that the drain current $I_D$ is low, but strongly depends on changes of the gate voltage $V_G$ (i.e., maximum sensitivity to changes in the 2DEG channel region 114A exist). In accordance with one embodiment, sensor 100 is operated in subthreshold region 701 during sensing operations, such that the presence of any external influences 150 will result in maximum changes in the measured drain current $I_D$.

In accumulation region 702 (i.e., for gate voltages $V_G$ in the range of about 0 to 4 Volts), the 2DEG channel regions 114A-114C are not depleted, such that the drain current $I_D$ is high, but the sensitivity to changes in the gate voltage $V_G$ is low.

Although curves in FIG. 7 illustrate a source-to-drain voltage of 3 Volts, it is understood that other source-to-drain voltages can be used in other embodiments. For example, in other embodiments, the source-to-drain voltage $V_{SD}$ can have a value in the range of about 0.1 Volt to 50 Volts for various sensor dimensions. Similarly, in other embodiments, the gate voltage necessary to operate in the subthreshold region can be in the range of about −1 Volt to −40 Volts for various sensor dimensions.

Curve 711 illustrates the response of sensor 100 when the gap G has a width (NGW) of 0.45 microns. Curve 712 illustrates the response of sensor 100 when the gap G has a width (NGW) of 1.0 microns. As illustrated, when sensor 100 has a wider gap G, the $I_D/V_G$ characteristic is shifted to the left (i.e., higher drain currents $I_D$ will exist for the same gate voltage $V_G$). Moreover, when sensor 100 has a wider gap G, the 'off' current of the sensor 100 is higher (e.g., the off current of sensor 100 is about 75E-6 Amps for a gap width of 0.45 microns, and about 150E-6 Amps for a gap width of 1.0 micron).

Figure 8:
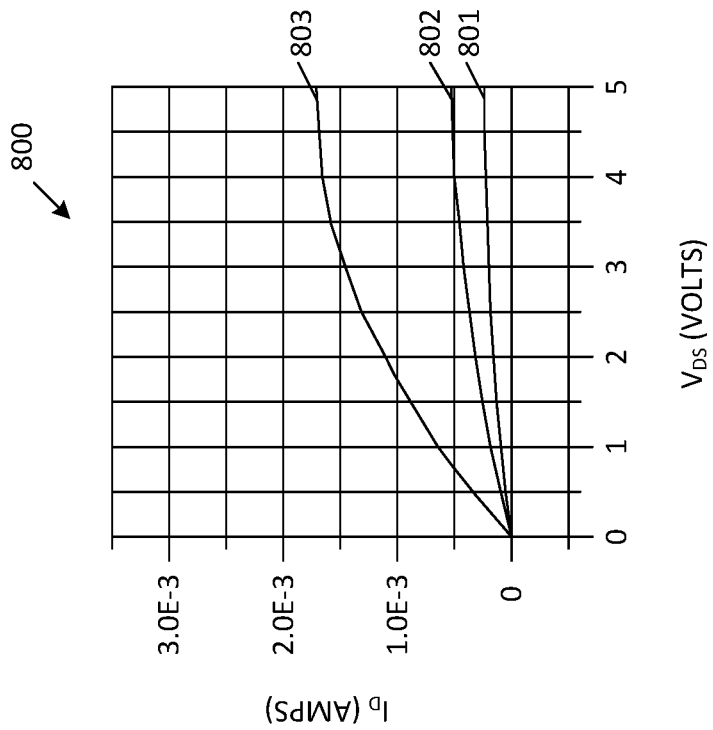
FIG. 8 is a graph illustrating drain currents of the electrostatically controlled sensor of FIG. 1 for various source-to-drain voltages, at a constant gate voltage of −8 Volts.

FIG. 8 is a graph 800 illustrating the drain current ($I_D$) of electrostatically controlled sensor 100 (with a 0.45 micron gap G, in the absence of exposure to external influences 150) for various source-to-drain voltages ($V_{SD}$), at different gate voltages ($V_G$). Curve 801 corresponds with a gate voltage $V_G$ of −8 Volts. Curve 802 corresponds with a gate voltage $V_G$ of −6 Volts. Note that in curves 801 and 802, the current in the 2DEG channel region 114A dominates, so there is sensitivity to changes in current in the 2DEG channel region 114A due to exposure to external influences 150 in the sensing area SA.

Curve 803 corresponds with a positive gate voltage $V_G$ of +8 Volts, wherein the drain current $I_D$ is flowing both in 2DEG channel region 114A under the gap G and the 2DEG channel regions 114B-114C under the gate electrodes 151 and 152. Note that in curve 803, the current in the 2DEG channel regions 114B-114C dominates, so there is no sensitivity to changes in current in the 2DEG channel region 114A due to exposure to external influences 150 in the sensing area SA.

Note that increasing the width of the gap G from 0.45 microns to 1.0 microns would significantly increase the drain current $I_D$ in the illustrated example of FIG. 8.

The multiple gaps $G_1$-$G_7$ (and corresponding sensing areas $SA_1$-$SA_7$) provided by sensor 400 effectively provide a wider gap G, which advantageously enables sensor 400 to be more sensitive to the presence of external influences 150, since the measured currents are higher, and thus signal to noise ratio increases.

Although sensors 100 and 400 provide source and drain contacts 121-122 that are in ohmic contact with 2DEG channel 114, in other embodiments, these ohmic contacts can be replaced with large capacitors that form capacitive contacts to 2DEG channel 114. The use of such large capacitors is described in more detail below.

Figure 9A:
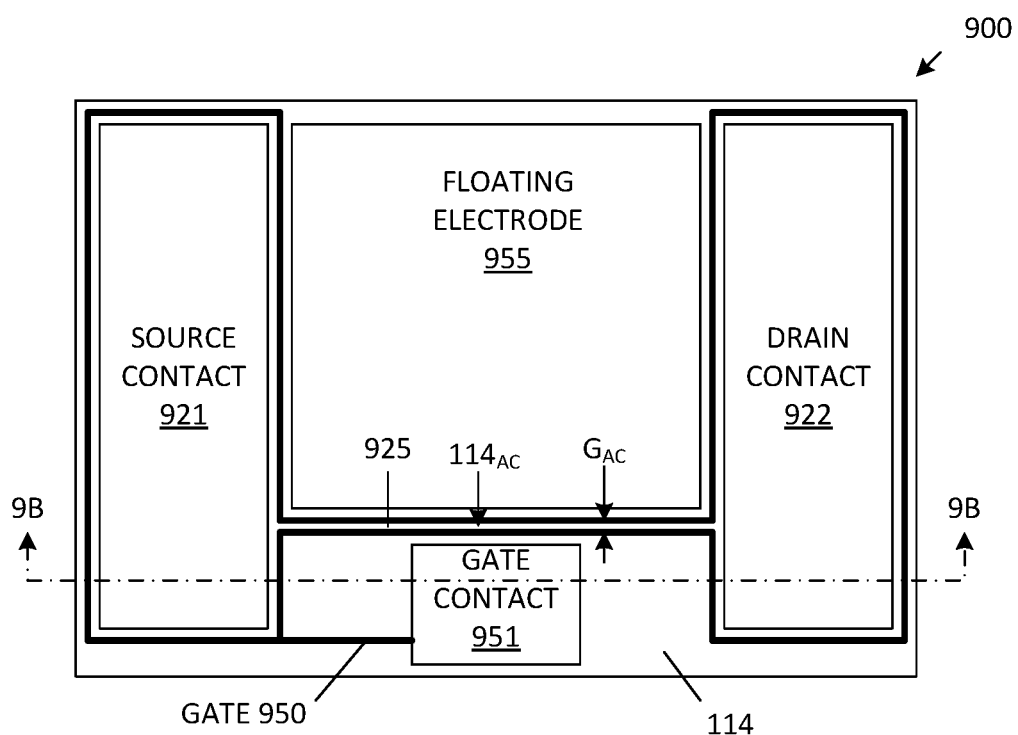
FIG. 9A is a top view of an electrostatically controlled sensor that implements capacitive source and drain contacts in accordance with an alternate embodiment of the present invention.
Figure 9B:
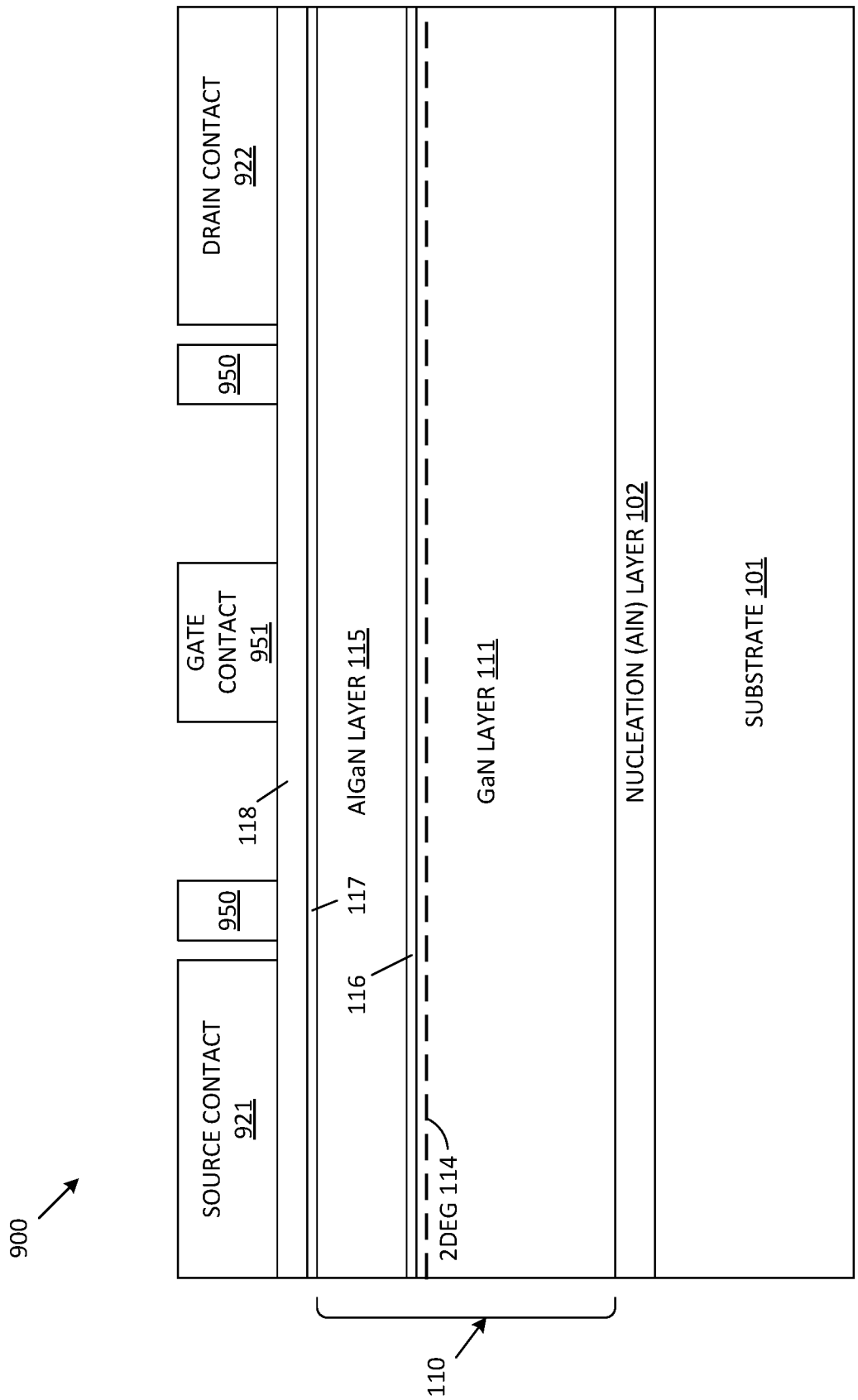
FIG. 9B is a cross-sectional view of the sensor of FIG. 9 along section line 9B-9B in accordance with one embodiment of the present invention.

FIG. 9A is a top view of an electrostatically controlled sensor 900 that implements capacitive contacts in accordance with an alternate embodiment of the present invention. FIG. 9B is a cross-sectional view of sensor 900 along section line 9B-9B of FIG. 9A. Because sensor 900 is similar to sensor 100, similar elements in FIGS. 1 and 2A-2C are labeled with similar reference numbers in FIGS. 9A-9B. Distinguishing features of the sensor 900 in FIG. 9 include the absence of isolation regions 119, the absence of front side contact 130, and the absence of ohmic contacts to 2DEG channel 114.

In the embodiment of FIGS. 9A-9B, source capacitive contact 921 and drain capacitive contact 922 are metal structures formed over the dielectric layer 118 and the AlGaN layer 115 (i.e., source contact 921 and drain contact 922 do not contact the underlying 2DEG channel 114). As a result, source and drain capacitive contacts 921 and 922 form large capacitors with dielectric layer 118 and AlGaN layer 115 in combination with underlying 2DEG channel 114 (i.e., source contact 921 and drain contact 922 are capacitively coupled to 2DEG channel 114 through AlGaN layer 115 and dielectric layer 118). In one embodiment, the source and drain contacts 921-922 each has a layout area of about $10^{-3}$ cm$^2$ (e.g., a length of about 500 microns and a width of about 200 microns). In another embodiment, the lengths and widths of the source and drain contacts 921-922 can vary in the range of about 100 microns to about 1 millimeter.

Gate electrode 950 and gate contact 951 are also made of metal formed on top of gate dielectric layer 118. Gate electrode 950 includes narrow metal lines that extend around the source capacitive contact 921 and the drain capacitive contact 922, and define a narrow rectangular sensing area 925 between the source and drain capacitive contacts 921-922, as illustrated. The portions of the gate electrode 950 that define the sensing area 925 are separated by a gap $G_{AC}$ having a width in the range of about 0.5 to 4 microns. The portion of the 2DEG channel 114 that exists under the sensing area 925 is labeled as 2DEG channel region $114_{AC}$.

Optional floating electrode 955 is also made of metal formed on top of gate dielectric layer 118. Floating electrode 955 increases the capacitive coupling between source and drain capacitive contacts 921-922 through the 2DEG channel 114 in case no voltage (or a small negative voltage) is applied to the gate contact 951.

Figure 10:
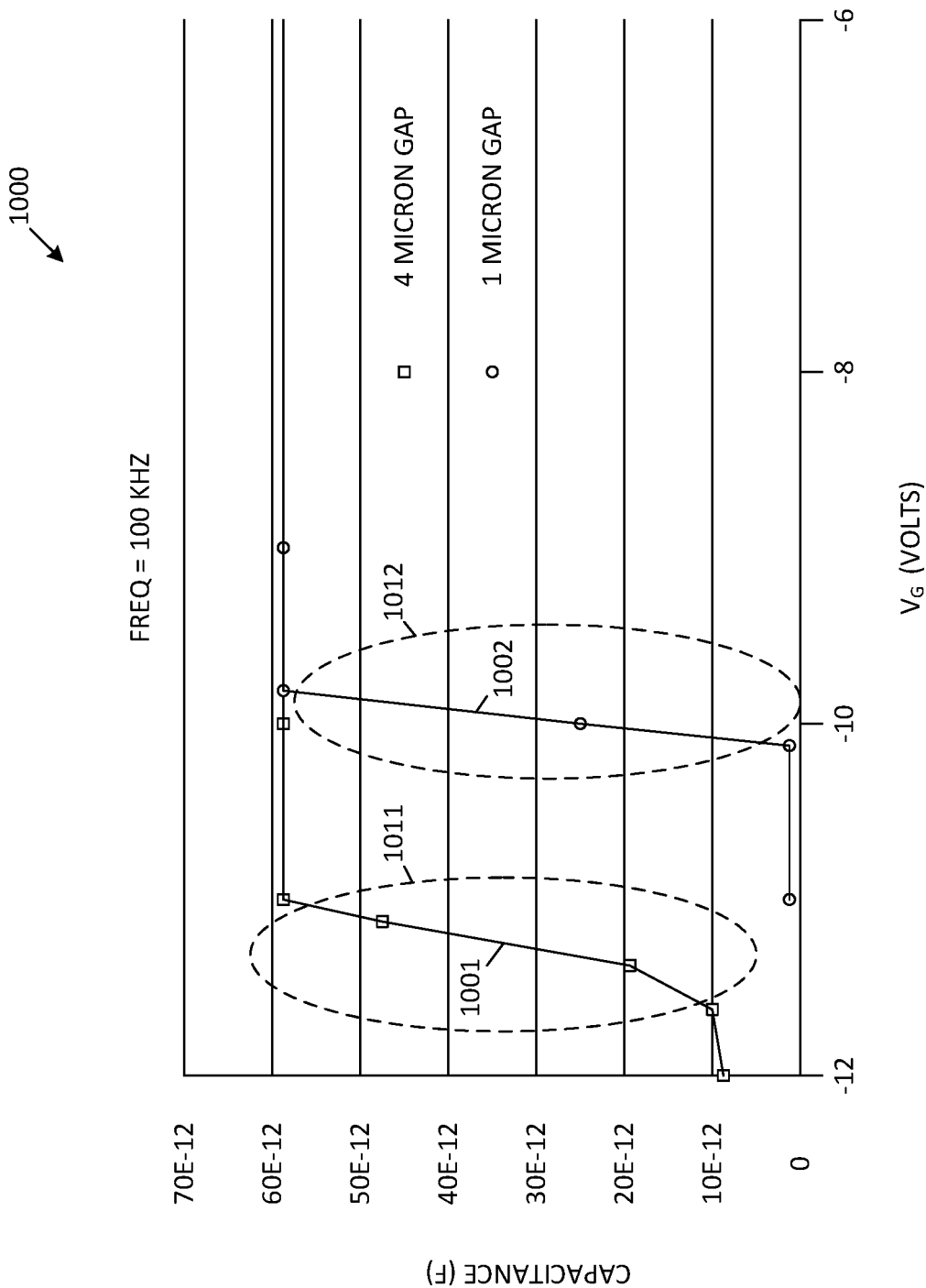
FIG. 10 is a graph illustrating the measured capacitances of the sensor of FIG. 9 for various gate voltages and various gap widths, when applying an alternating current (AC) input signal having a frequency of 100 kHz to a source capacitive contact in accordance with one embodiment of the present invention.

The measured characteristic of sensor 900 is the capacitance between the source contact 921 and drain contact 922. FIG. 10 is a graph 1000 illustrating the measured capacitances of sensor 900 for various gate voltages ($V_G$) and various widths of the gap $G_{AC}$, when transmitting an alternating current (AC) input signal having a frequency of 100 kHz between the source capacitive contact 921 and the drain capacitive contact 922. Although FIG. 10 illustrates the operation of sensor 900 response to a 100 kHz signal, it is understood that sensor 900 is capable of operation in response to AC signals having other frequencies. In a particular embodiment, sensor 900 operates in response to signals having frequencies in the range of about 1 kHz to 10 MHz.

Curve 1001 shows measured capacitances of a sensor 900 having a 4 micron wide gap $G_{AC}$, and curve 1002 shows measured capacitances of a sensor 900 having a 1 micron wide gap $G_{AC}$. Each of these curves 1001 and 1002 exhibits a subthreshold region and an accumulation region, in the manner described above in connection with FIG. 6. As described in more detail below, sensor 900 is biased in the subthreshold region when performing sensing operations. The subthreshold regions are labeled 1011 and 1012 in FIG. 10.

When sensor 900 is biased in the accumulation region (i.e., gate voltage $V_G$ is about −11 Volts or greater when the width of gap $G_{AC}$ is 4 microns, or gate voltage $V_G$ is about −9.9 Volts or greater when the width of gap $G_{AC}$ is 1 micron), the entire 2DEG channel 114 is conductive (and the current path from source capacitive contact 921 to drain capacitive contact 922 through the 2DEG channel 114 under the floating electrode 955 is not blocked), such that the measured capacitance of sensor 900 effectively includes the source contact 921 capacitance connected in series with the drain contact 922 capacitance. The measured capacitance value in the accumulation region (i.e., about 58 pF in FIG. 10) is equal to half of the source contact 921 capacitance (assuming the capacitance of source contact 921 is equal to the capacitance of drain contact 922).

In the subthreshold regions 1011 and 1012, a negative voltage at or near the level of the threshold voltage (Vt) of the HEMT structure is applied to the gate contact 951. In these subthreshold regions 1011 and 1012, the DC voltage applied to the gate electrode 950 causes current flow between source and drain capacitive contacts 921-922 to be blocked everywhere except within the 2DEG channel region $114_{AC}$. That is, the 2DEG channel 114 (including the region of the 2DEG channel 114 located area under floating electrode 955), with the exception of the 2DEG channel region $114_{AC}$, is switched off. Under these conditions, the 2DEG channel region $114_{AC}$ is partially depleted, such that the resistance of this 2DEG channel region $114_{AC}$ is extremely sensitive to changes in the gate voltage $V_G$. Under these conditions, the resistance of 2DEG channel region $114_{AC}$ is also extremely sensitive to the presence of external influences 150.

In the subthreshold region, the significant resistance of the 2DEG channel region $114_{AC}$ is coupled in series with the capacitances of the source and drain contacts 921-922. Changes in the resistance of 2DEG channel region $114_{AC}$ result in changes in the measured capacitance of sensor 900. As illustrated by FIG. 10, as the resistance of the 2DEG channel region $114_{AC}$ increases, the measured capacitance of sensor 900 decreases. Because the other portions of the 2DEG channel 114 located between the source and drain contacts 921 and 922 are switched off by the DC voltage applied to the gate electrode 950, the measured device capacitance becomes extremely sensitive to the resistance of the 2DEG channel region $114_{AC}$.

As illustrated by FIG. 10, a sensor 900 having a wider gap $G_{AC}$ requires a larger negative gate voltage $V_G$ to increase the resistance of the 2DEG channel region $114_{AC}$, thereby reducing the measured capacitance.

As the gate voltage $V_G$ becomes increasingly negative (e.g., more negative than about −11.5 Volts when the width of gap $G_{AC}$ is 4 microns, and more negative than about −10.1 Volts when the width of gap $G_{AC}$ is 1 micron), the resistance of 2DEG channel region $114_{AC}$ becomes larger, increasing to a (saturated) resistance value. When the width of the gap $G_{AC}$ is 4 microns, the saturated resistance value is about 200 kOhms, which results in a measured capacitance of about 10 pF (at 100 kHz). Note that the 4 micron wide 2DEG channel region 114AC cannot be completely closed (i.e., completely depleted) by the fringing fields associated with the gate voltage $V_G$ applied to gate electrode 950. Rather, depletion regions extend about 1 to 1.5 micron from both sides of the 2DEG channel portion $114_{AC}$, such that the 4 micron wide channel $114_{AC}$ cannot be completely depleted by the fringing fields. When the width of the gap $G_{AC}$ is 1 micron, the 2DEG channel region 114AC is completely depleted, such that the saturated resistance value is very high, leading to a measured capacitance close to 0 pF.

The gate voltage $V_G$ used for sensing operations is selected to be in the subthreshold regions 1011 and 1012 (i.e., regions of strong capacitance change). This advantageously allows external influences 150 (which change the resistance of 2DEG channel region $114_{AC}$) to have a more extreme effect on the measured capacitance of sensor 900.

The use of large capacitive source/drain contacts 921-922 in place of ohmic source/drain contacts 121-122 greatly simplifies the fabrication process required to fabricate the sensor (because the formation of capacitive source/drain contacts 921-922 only requires the formation of dielectric layer 118 and the patterning of an overlying metal layer). However, the required layout area of sensor 900 will typically be larger than the required layout area of sensors 100 and 400.

Different types of external influences 150 can be sensed in the above-described embodiments, including anything that results in changes to the conductivity of 2DEG layer 114. In various embodiments, sensitivity to the following external influences have been registered: environmental gases (e.g., $NO_2$), moisture, fluids at the surface, irradiation of the open surface with ultra-violet (UV) radiation, external magnetic fields, and temperature changes.

In accordance with one embodiment, sensors 100, 400 and 900 can be electrically refreshed. Note that after exposure to external influences 150, some generated holes may be trapped in GaN layer 111 (or excited electrons may leave immobile positive ions after trap excitation). The trapped positive charge enhances the conductivity of the 2DEG channel 114. Thus, the conductivity of the sensors 100, 400 and 900 is higher after exposure to external influences 150 (consistent with PPC models). In accordance with one embodiment, the trapped positive charges are discharged using an electrical refresh operation. The electrical refresh operation is described in connection with sensor 100, but it is understood that sensors 400 and 900 can be refreshed in a similar manner.

In one embodiment, the electrical refresh operation is performed by connecting the source contact 121 and the drain contact 122 to ground (0 Volts), placing the gate electrodes 451-458 in a floating state, and applying a high voltage in the range of about 3 to 40 Volts (and preferably in the range of about 20-25 Volts) to the front side electrode 130 (and therefore to GaN layer 111) for several seconds. Under these conditions, holes trapped in the GaN layer 111 (which lead to PPC) are discharged by the electric field (to the source contact 121 and the drain contact 122). In an alternate embodiment, an electrical refresh can be performed by applying a high voltage to source contact 121 and drain contact 122 (while grounding the front side electrode 130), although this alternate electrical refresh method is less efficient. After a refresh operation is complete, the trapped positive charge is removed from the GaN layer 111, thereby advantageously eliminating PPC effects.

Note that although sensor 900 may not include a front side electrode to apply a voltage to the GaN layer 111, an embodiment described below (FIG. 11B) specifies a back side electrode 1102 that enables a voltage to be applied to the GaN layer 111 of sensor 900, thereby facilitating electrical refresh of sensor 900.

As described above, electrical refresh operations can be used to discharge positive charge trapped in GaN layer 111 after exposure to external influences 150. In an alternate embodiment, this trapped positive charge can be discharged by heating (or a combination of heating and electrical refresh). In this case, heating must be performed rapidly. In one embodiment, the sensor is fabricated on a membrane with a low thermal mass, allowing the sensor to be heated with a relatively low-power heater in a relatively fast manner.

Figure 11A:
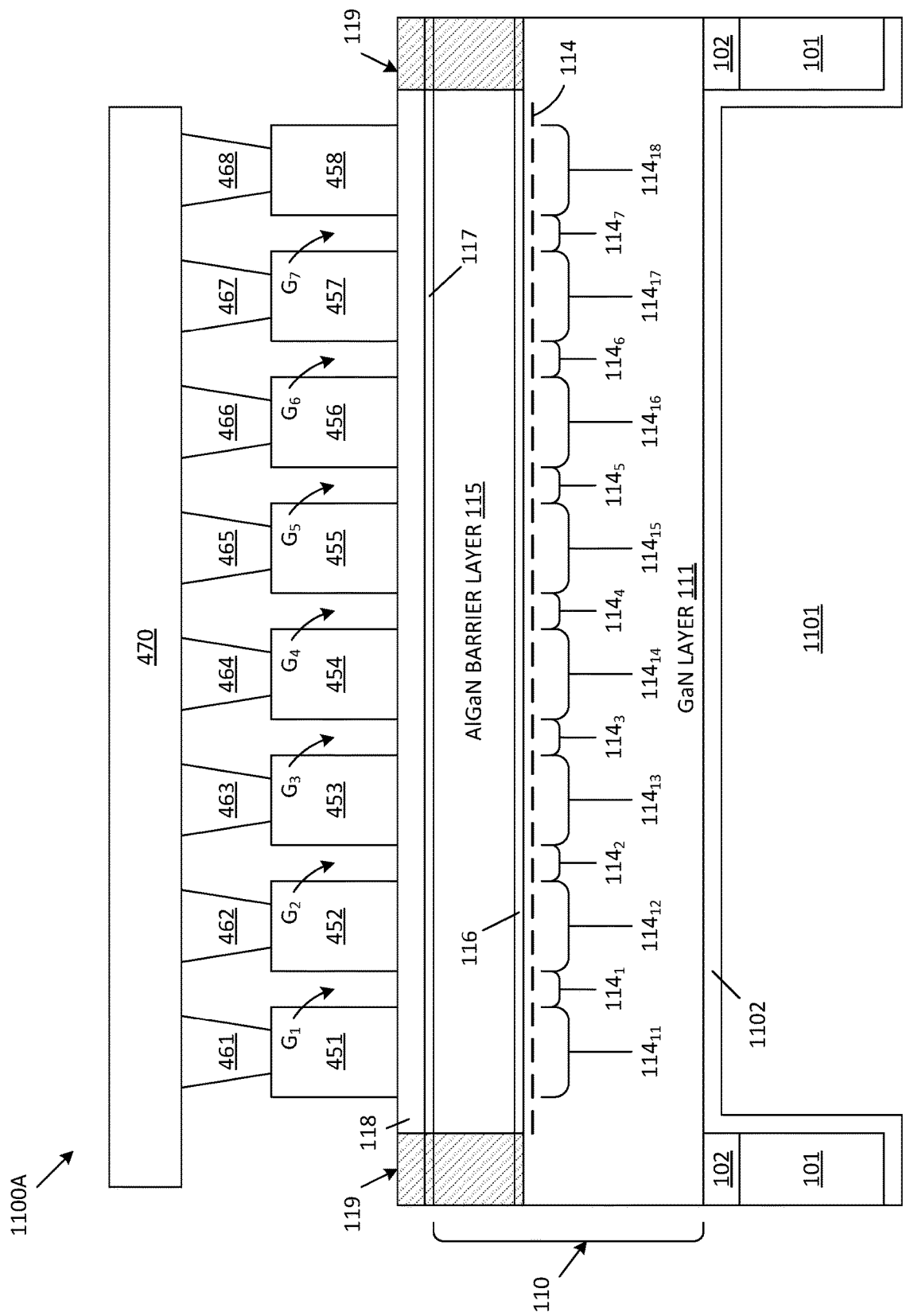
FIG. 11A is a cross sectional view of an electrostatically controlled sensor fabricated on a membrane having a low thermal mass in accordance with one embodiment of the present invention.

FIG. 11A is a cross sectional view of an electrostatically controlled sensor 1100A fabricated on a membrane having a low thermal mass in accordance with one embodiment of the present invention. Because sensor 1100A is similar to sensor 400, similar elements in FIGS. 5A and 11A are labeled with similar reference numbers. Notably, sensor 1100A does not include the front side electrode 130 of sensor 400. To form a membrane having a low thermal mass, a cavity 1101 is etched from the back side of the substrate 101, using the AlN nucleation layer 102 as an etch stop. The cavity 1101 is then extended by removing the exposed portions of the AlN layer 102, thereby providing access to the lower surface of GaN layer 111. In one embodiment, the cavity 1101 is formed under the 2DEG channel 114 between the source and drain contacts 121-122. Note that the cavity 1101 may extend well beyond the space between the source and drain contacts 121-122. In this manner, the portions of sensor 1100A located above the cavity 1101 form a membrane having a low thermal mass.

An electrical contact 1102 to GaN layer 111 is formed by depositing a metal structure (e.g., Ti/TiN/Al stack) on the back side of the substrate 101, as illustrated. Note that electrical contact 1102 replaces the front side metal contact 130 of sensor 400. In an alternate embodiment, the backside electrical contact 1102 is not formed, and a front side metal contact (similar to front side metal contact 130) is used to contact GaN layer 111 of sensor 1100A. In this embodiment, the front side metal contact is formed outside of the membrane area defined by the cavity 1101.

Figure 11B:
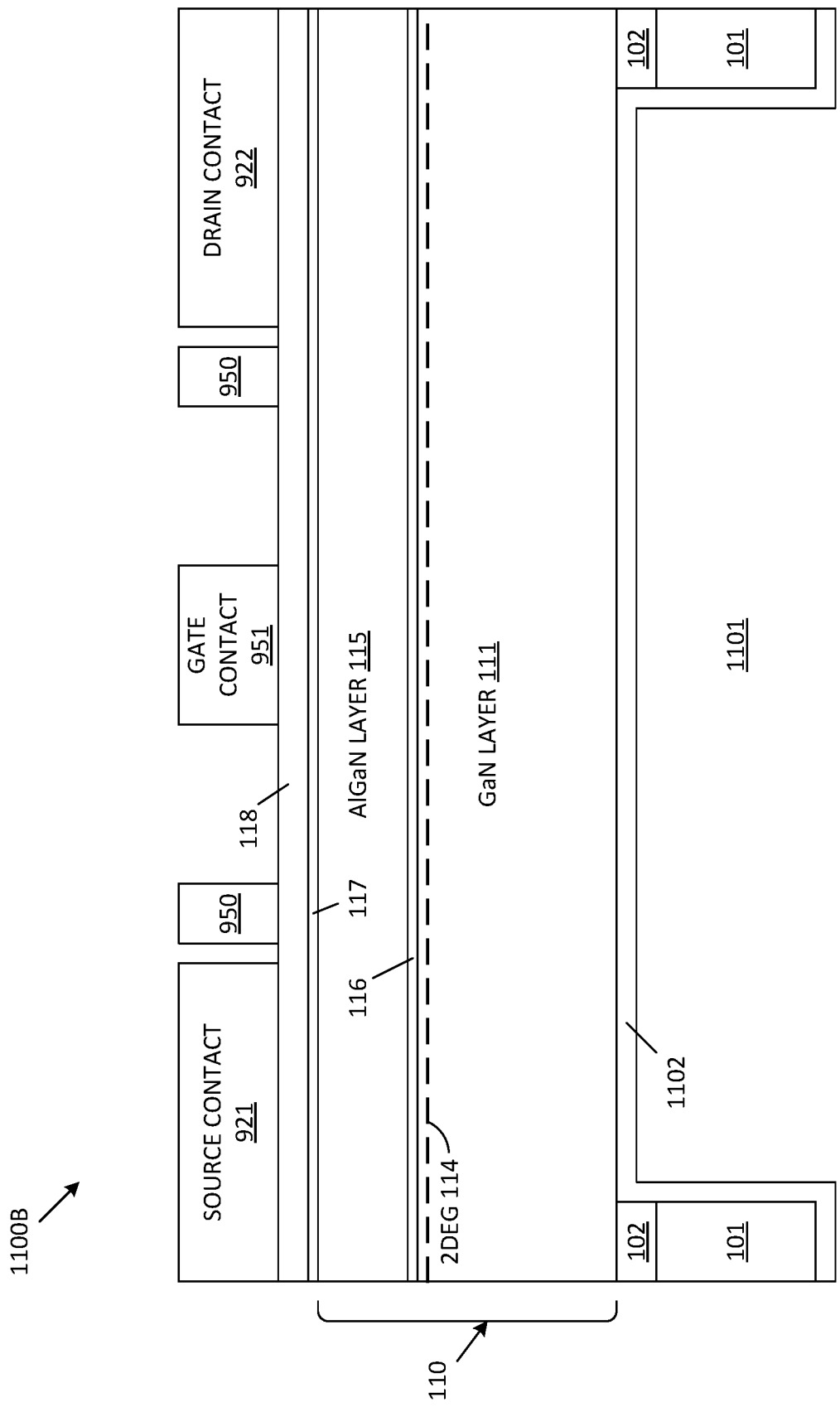
FIG. 11B is a cross sectional view of an electrostatically controlled sensor fabricated on a membrane having a low thermal mass in accordance with another embodiment of the present invention.

FIG. 11B is a cross sectional view of an electrostatically controlled sensor 1100B in accordance with another embodiment of the present invention. Because sensor 1100B is similar to sensor 900, similar elements in FIGS. 9B and 11B are labeled with similar reference numbers. As illustrated by FIG. 11B, cavity 1101 is formed through the substrate 101 and AlN layer 102 in the manner described above, wherein the cavity 1101 defines a membrane area. Backside electrical contact 1102 extends into cavity 1101 and provides an electrical connection to GaN layer 111 of sensor 1100B (thereby enabling electrical refresh operations).

In accordance with one embodiment, a heater element is added to the above-described sensors. The heater element is used to heat the sensor between sensing operations, thereby eliminating charge build-up in the sensor between sensing operations.

Figure 12:
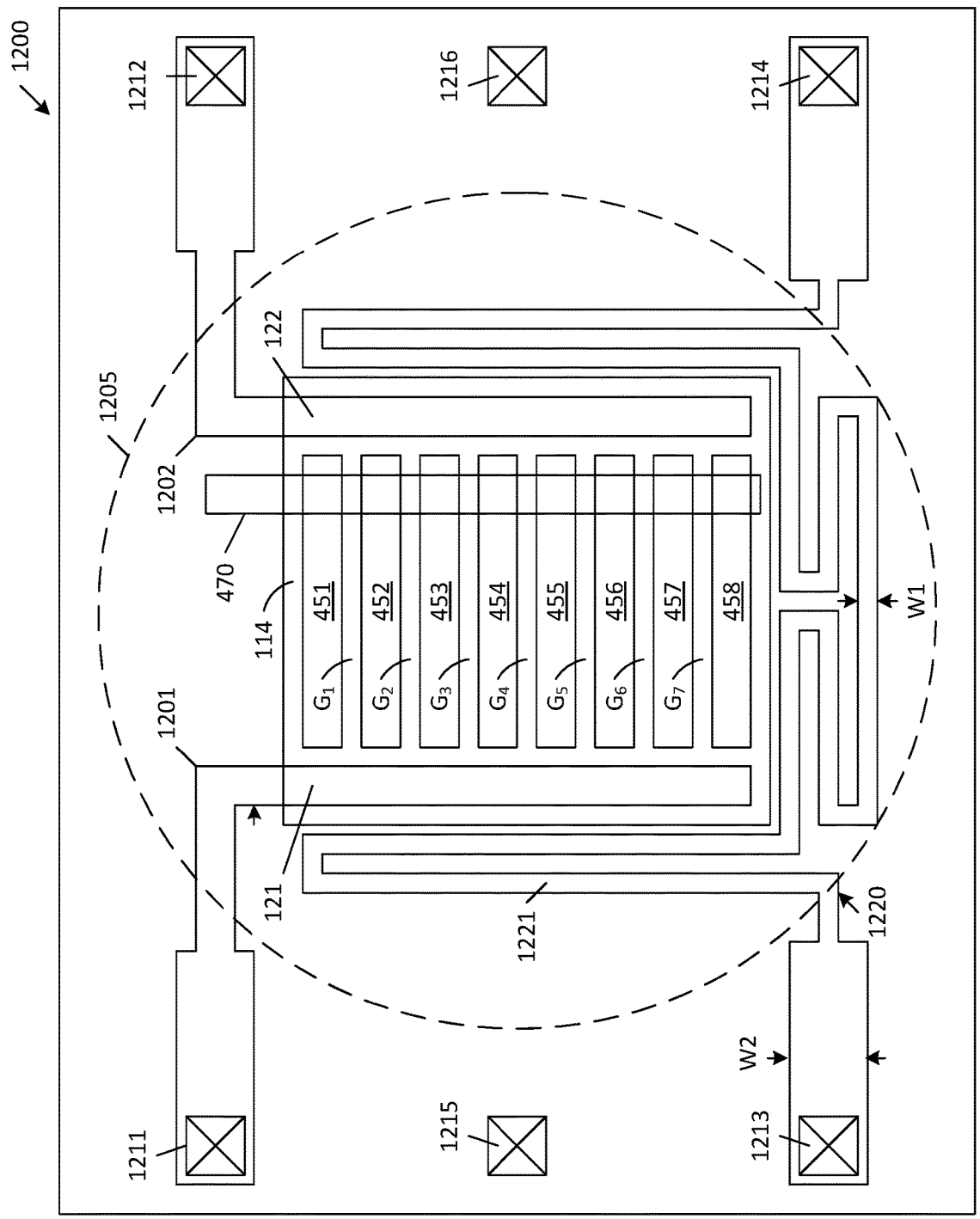
FIG. 12 is a top view of an electrostaically controlled sensor that includes a heater element in accordance with one embodiment of the present invention.

FIG. 12 is a top view of a sensor 1200 that includes a heater element 1220 in accordance with one embodiment of the present invention. Sensor 1200 includes source and drain contacts 121 and 122, gate electrodes 451-458, gate connector 470 and 2DEG channel 114, as described above in connection with sensor 400 of FIG. 4. The source contact 121 is connected to a source metal trace 1201, and the drain contact 122 is connected to a drain metal trace 1202. The ends of heater element 1220 are connected to a first contact 1213 and a second contact 1214.

In the embodiment illustrated by FIG. 12, the 2DEG channel 114 and the heater element 1220 are located on a thin membrane defined by a cavity 1205 formed in the backside of the sensor 1200. Note that cavity 1205 is similar to cavity 1101 described above in connection with the sensor 1100A of FIG. 11A. Cavity 1205 advantageously reduces the thermal mass of the sensor 1200, thereby allowing heat generated by passing current through the heater element 1220 to more effectively refresh the sensor 1200. Although cavity 1205 is illustrated as a circle in FIG. 12, it is understood that cavity 1205 can have other shapes. It is also understood that cavity 1205 can be eliminated in other embodiments.

To ensure a high voltage drop (and therefore high heat generation) on the portions of the heater element 1220 located over the cavity 1205, the heater element 1220 has a first (relatively small) width W1 (and therefore a relatively high resistance) over the cavity 1205, and a second (relatively large) width W2 (and therefore a relatively small resistance) outside the boundary of the cavity 1205.

Contacts 1211, 1212, 1213 and 1214 allow the required operating voltages to be applied to metal traces 1201, 1202, 1203 and 1204, respectively. Contacts 1215-1216 provide electrical connections to GaN layer 111.

Sensor 1200 implements sensing operations in the manner described above. That is, the desired source-to-drain voltage ($V_{DS}$) is applied across source contact 1211 and drain contact 1212, the desired gate voltage $V_G$ is applied to metal trace 470, and the contacts 1215-1216 are left floating. The contacts 1213-1214 to the heater element 1220 are also left floating (i.e., the heater is disconnected) during the sensing operations.

Sensor 1200 also implements thermal refresh operations in the following manner. Contact 1213 is grounded and a high positive voltage (e.g., 5 to 50 Volts) is applied to contact 1214 and also to contacts 1215-1216. The current forced through heater element 1220 is high enough to generate the heat necessary to eliminate excess holes from the 2DEG channel 114. In one embodiment, a current in the range of about 1 mA to 20 mA is passed through heater element 1220.

In one embodiment, heater element 1220 is implemented by a 2DEG resistor formed in GaN layer 111. In another embodiment, heater element 1220 is implemented by a polysilicon or metal trace, which is formed over the upper surface of sensor 1200 (e.g., over silicon nitride layer 118). Although heater element 1220 extends around the perimeter of the 2DEG channel 114 in FIG. 12 (for clarity in illustration), it is understood that heater element 1220 may extend over (or through) 2DEG channel 114 in other embodiments.

In one embodiment, sensor 1200 may implement electrical refresh at the same time as the thermal refresh. As described above, electrical refresh is implemented by disconnecting the source contact 1211, connecting the drain contact 1212 to ground, and applying a high voltage to contacts 1215-1216.

In the manner described above, sensors of the present invention are able to maintain operation in a subthreshold region with a depletion type HEMT using a geometry where narrow spaces between long gate electrodes fully control the current flow. In areas under the gates, the current flow is blocked when a negative voltage exceeding the threshold voltage Vt is applied, while fringing electric fields enable subthreshold operation in regions having open upper surfaces.

The sensor of the present invention advantageously features ultra-low power consumption and has a high ratio of sensing signals relative to offset values.

The sensor or the present invention is advantageously able to operate at ambient temperatures in the range of about −40° C. to 500° C. This is due to large (3.4 eV) bandgap of GaN and even larger bandgap of AlGaN.

Moreover, sensors of the present invention can be readily integrated into conventional CMOS fabrication processes because of the simple construction of these sensors, and due to the use of CMOS fab friendly materials in the fabrication process.

In addition, sensors of the present invention can be easily refreshed to compensate for charge build-up in GaN layer 111.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. An electrostatically controlled sensor comprising:
a gallium nitride (GaN) layer;
an aluminum gallium nitride (AlGaN) layer formed over an upper surface of the GaN layer, wherein a two-dimensional electron gas (2DEG) channel exists at the upper surface of the GaN layer;
a source contact electrically coupled to the 2DEG channel through the AlGaN layer;
a drain contact electrically coupled to the 2DEG channel through the AlGaN layer; and
a gate dielectric formed over the AlGaN layer;
a plurality of gate electrodes formed over the gate dielectric, wherein each of the gate electrodes extends from an area adjacent to the source contact to an area adjacent to the drain contact, wherein the plurality of gate electrodes are separated by one or more gaps, each of the one or more gaps extending between an area adjacent to the source contact and an area adjacent to the drain contact, wherein each of the one or more gaps defines a corresponding sensing area between the plurality of gate electrodes for receiving an external influence, and wherein each sensing area is located over a corresponding underlying 2DEG channel region of the 2DEG channel.

2. The electrostatically controlled sensor of claim 1, wherein the GaN layer is formed over a silicon substrate.

3. The electrostatically controlled sensor of claim 1, wherein an upper surface of each sensing area comprises a portion of the AlGaN layer.

4. The electrostatically controlled sensor of claim 1, wherein an upper surface of each sensing area comprises a GaN layer located over the AlGaN layer.

5. The electrostatically controlled sensor of claim 1, wherein an upper surface of each sensing area comprises a portion of the gate dielectric.

6. The electrostatically controlled sensor of claim 5, wherein the gate dielectric comprises silicon nitride or aluminum oxide.

7. The electrostatically controlled sensor of claim 1, further comprising a functionalization layer located over each sensing area, wherein the functionalization layer interacts with the external influence to amplify a response in the underlying 2DEG channel region of the 2DEG channel.

8. The electrostatically controlled sensor of claim 1, wherein the plurality of gate electrodes comprise metal.

9. The electrostatically controlled sensor of claim 1, where the plurality of gate electrodes have a thickness in the range of about 0.1 to 1 micron, and the gate dielectric has a thickness in the range of about 100 to 1000 Angstroms.

10. The electrostatically controlled sensor of claim 1, wherein the source electrode and the drain electrode are in ohmic contact with the 2DEG channel.

11. The electrostatically controlled sensor of claim 1, wherein the plurality of gate electrodes are commonly connected to an overlying metal trace.

12. The electrostatically controlled sensor of claim 1, wherein the source electrode and the drain electrode are capacitively coupled to the 2DEG channel.

13. The electrostatically controlled sensor of claim 1, wherein each of the one or more gaps each has a width in the range of about 0.1 micron to 10 microns between the gate electrodes.

14. The electrostatically controlled sensor of claim 1, wherein the GaN layer is located over a substrate, and wherein a cavity formed through a portion of the substrate exposes a portion of a lower surface of the GaN layer, wherein the plurality of gate electrodes are located over the cavity.

15. The electrostatically controlled sensor of claim 14, further comprising a heater element formed over the cavity.

16. The electrostatically controlled sensor of claim 15, wherein the heater element comprises a 2DEG resistor formed in the GaN layer.

17. The electrostatically controlled sensor of claim 15, wherein the heater element comprises a polysilicon or metal structure formed over the cavity.

18. The electrostatically controlled sensor of claim 14, further comprising a backside electrode located in the cavity and electrically coupled to the GaN layer.

19. The electrostatically controlled sensor of claim 1, further comprising a front side electrode that extends through the AlGaN layer to contact the GaN layer.

20. The electrostatically controlled sensor of claim 1, wherein each sensing area is rectangular.

21. The electrostatically controlled sensor of claim 1, wherein an electrical current between the source contact and the drain contact is a function of exposure of each sensing area to the external influence.

* * * * *